US012310092B2

(12) United States Patent
Huang et al.

(10) Patent No.: US 12,310,092 B2
(45) Date of Patent: May 20, 2025

(54) MULTI-FUNCTIONAL TRANSISTORS IN SEMICONDUCTOR DEVICES

(71) Applicant: Taiwan Semiconductor Manufacturing Company, Ltd., Hsinchu (TW)

(72) Inventors: Cheng-Chieh Huang, Kaohsiung (TW); Chen-Chieh Chiang, Kaohsiung (TW); Wen-Sheng Lin, Tainan (TW); Hsun-Jui Chang, Tainan (TW); Yen-Han Chen, Pingtung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 456 days.

(21) Appl. No.: 17/738,948

(22) Filed: May 6, 2022

(65) Prior Publication Data

US 2022/0406666 A1  Dec. 22, 2022

Related U.S. Application Data

(60) Provisional application No. 63/212,397, filed on Jun. 18, 2021.

(51) Int. Cl.
*H10D 84/03* (2025.01)
*H10D 30/01* (2025.01)
*H10D 30/62* (2025.01)
*H10D 64/01* (2025.01)
(Continued)

(52) U.S. Cl.
CPC ......... *H10D 84/038* (2025.01); *H10D 30/024* (2025.01); *H10D 30/6211* (2025.01);
(Continued)

(58) Field of Classification Search
CPC ..... H01L 21/823864; H01L 21/823814; H01L 21/823821; H01L 21/823871; H01L 27/0924; H01L 29/401; H01L 29/6656; H01L 29/66795; H01L 29/7851; H01L 29/41791; H01L 29/42384; H01L 29/0673; H01L 29/66439; H01L 21/31155; H01L 21/823412; H01L 21/823418; H01L 21/823468; H01L 29/42392;
(Continued)

(56) References Cited

U.S. PATENT DOCUMENTS 9,093,530 B2    7/2015  Huang et al.
9,171,929 B2   10/2015  Lee et al.
(Continued)

*Primary Examiner* — Fernando L Toledo
*Assistant Examiner* — Adam S Bowen
(74) *Attorney, Agent, or Firm* — Sterne, Kessler, Goldstein & Fox P.L.L.C.

(57) ABSTRACT

A semiconductor device with different gate structures and a method of fabricating the same are disclosed. The a method includes forming a fin structure on a substrate, forming a thermal oxide layer on top and side surfaces of the fin structure, forming a polysilicon structure on the thermal oxide layer, doping portions of the fin structure uncovered by the polysilicon structure to form doped fin portions, forming a nitride layer on the polysilicon structure and the thermal oxide layer, forming an oxide layer on the nitride layer, doping the nitride layer with halogen ions, forming a source/drain region in the fin structure and adjacent to the polysilicon structure, and replacing the polysilicon structure with a gate structure.

20 Claims, 24 Drawing Sheets

(51) Int. Cl.
*H10D 84/01* (2025.01)
*H10D 84/85* (2025.01)
*H10D 30/67* (2025.01)

(52) U.S. Cl.
CPC ........... *H10D 64/01* (2025.01); *H10D 64/021* (2025.01); *H10D 84/017* (2025.01); *H10D 84/0184* (2025.01); *H10D 84/0186* (2025.01); *H10D 84/0193* (2025.01); *H10D 84/853* (2025.01); *H10D 30/6219* (2025.01); *H10D 30/673* (2025.01)

(58) Field of Classification Search
CPC ............. H01L 29/78696; H01L 29/165; H01L 29/665; H01L 29/66545; H01L 29/775; H01L 29/7848; B82Y 10/00
See application file for complete search history.

(56) References Cited

U.S. PATENT DOCUMENTS

| | | | |
|---|---|---|---|
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 10,269,655 | B1 * | 4/2019 | Lee ..................... H01L 27/0924 |
| 2003/0139025 | A1 * | 7/2003 | Lee ....................... H01L 21/425 438/528 |
| 2018/0151706 | A1 * | 5/2018 | Lin ....................... H01L 29/785 |
| 2018/0308842 | A1 * | 10/2018 | Lee ................. H01L 21/823431 |

* cited by examiner

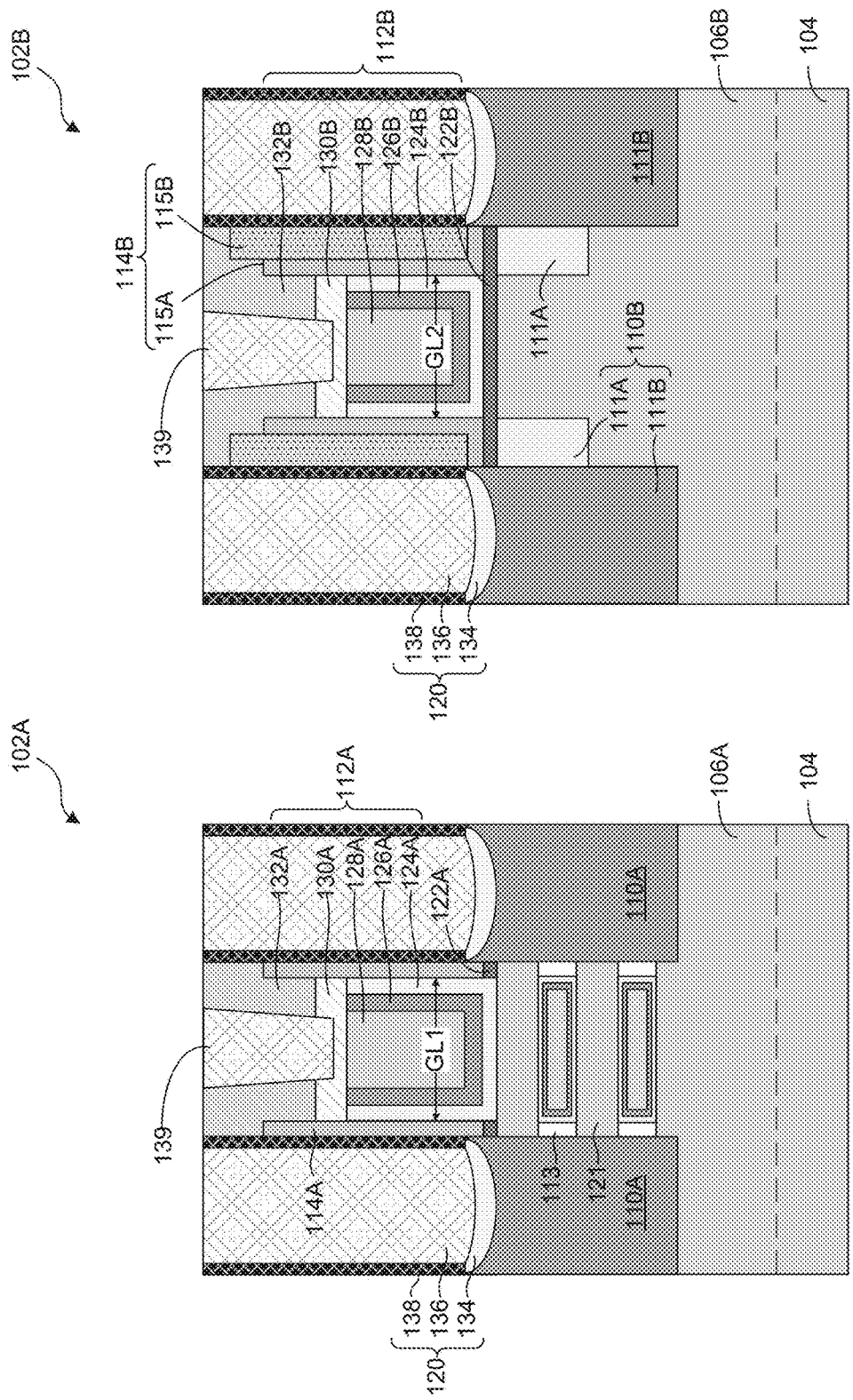

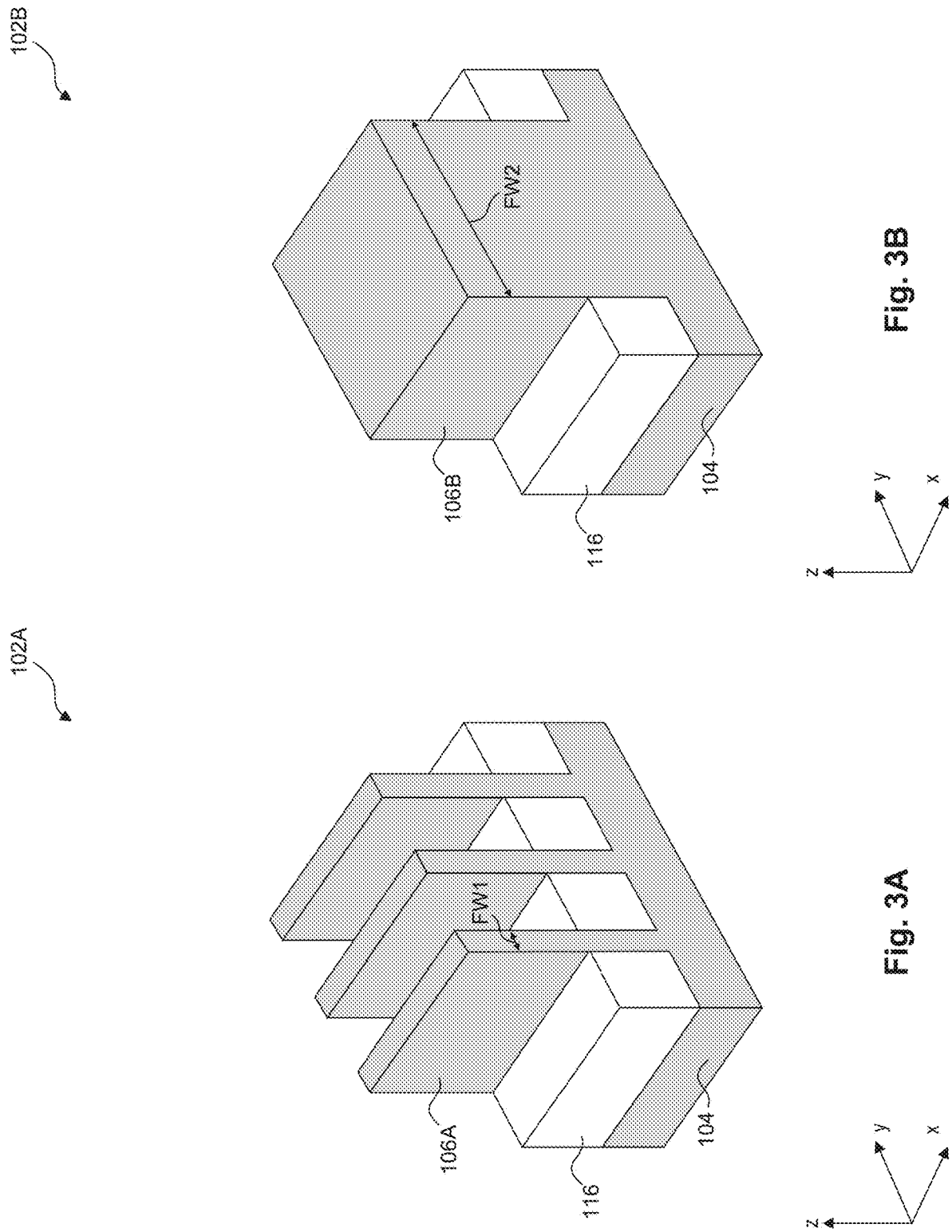

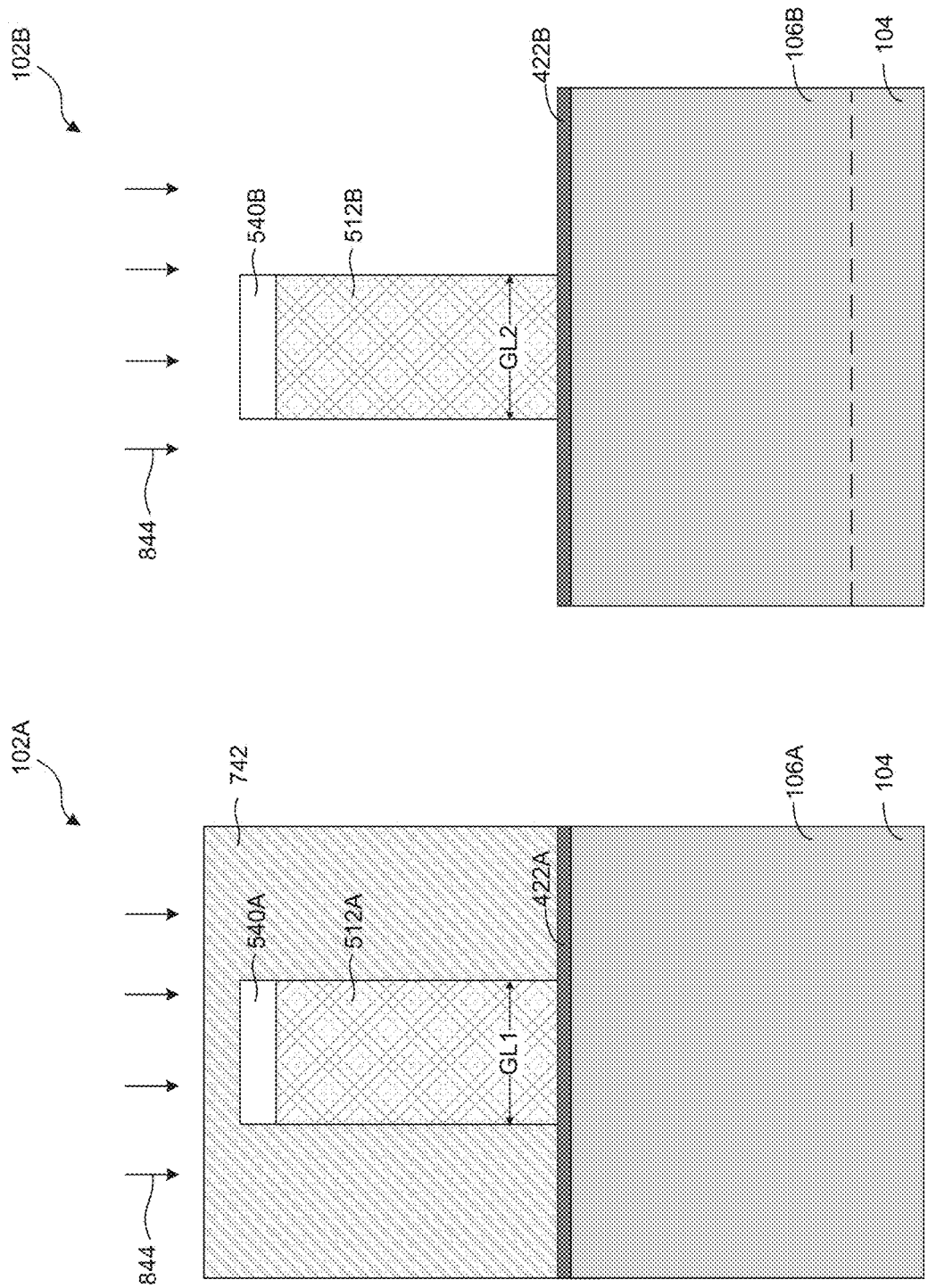

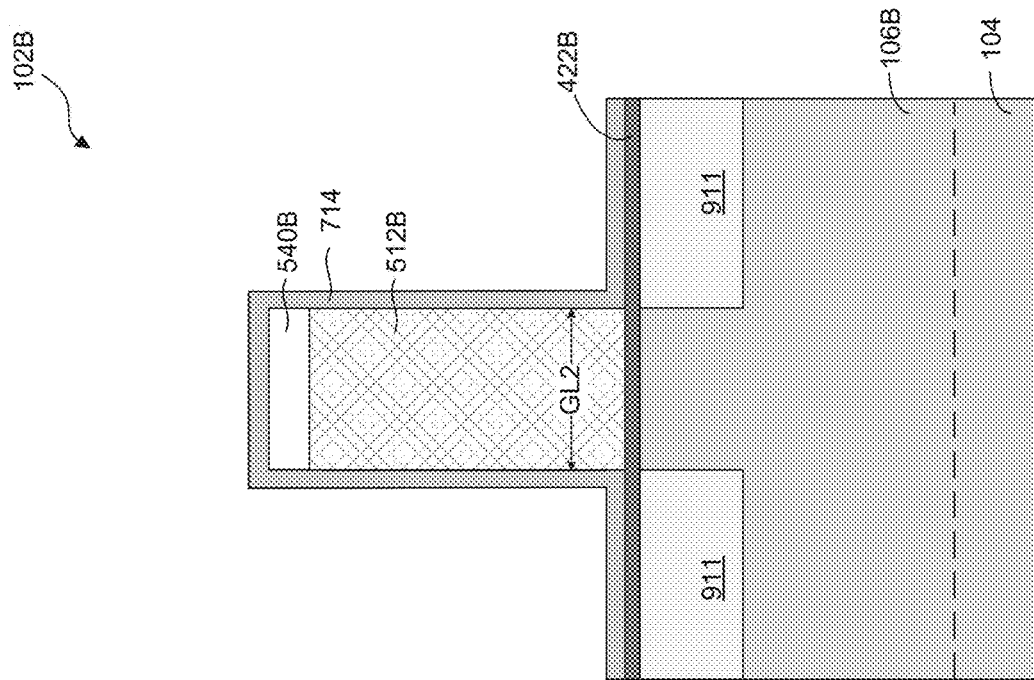
Fig. 11B
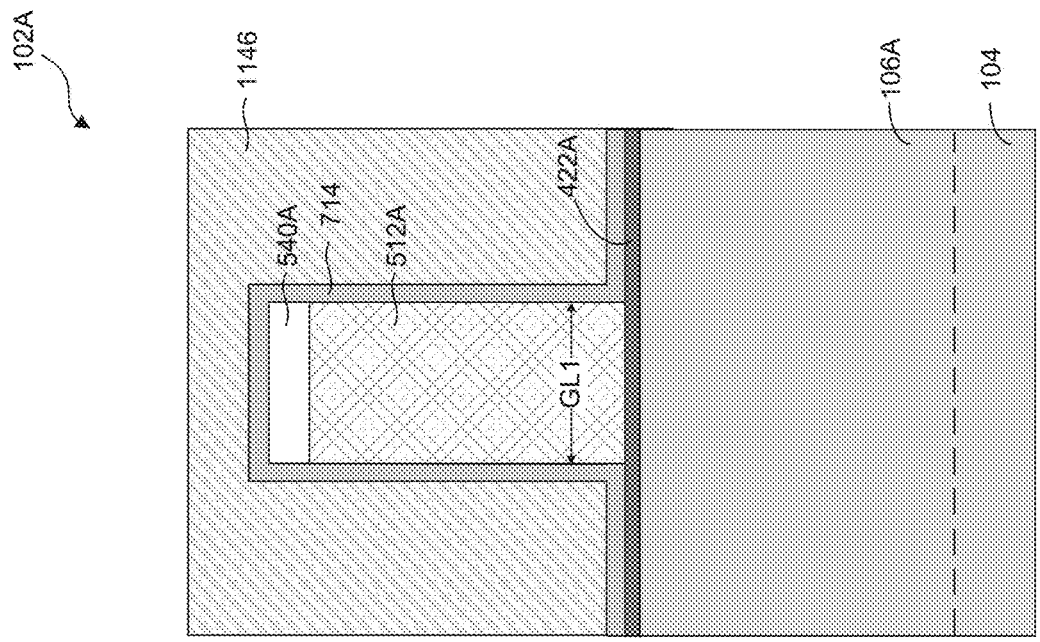
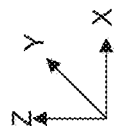
Fig. 11A

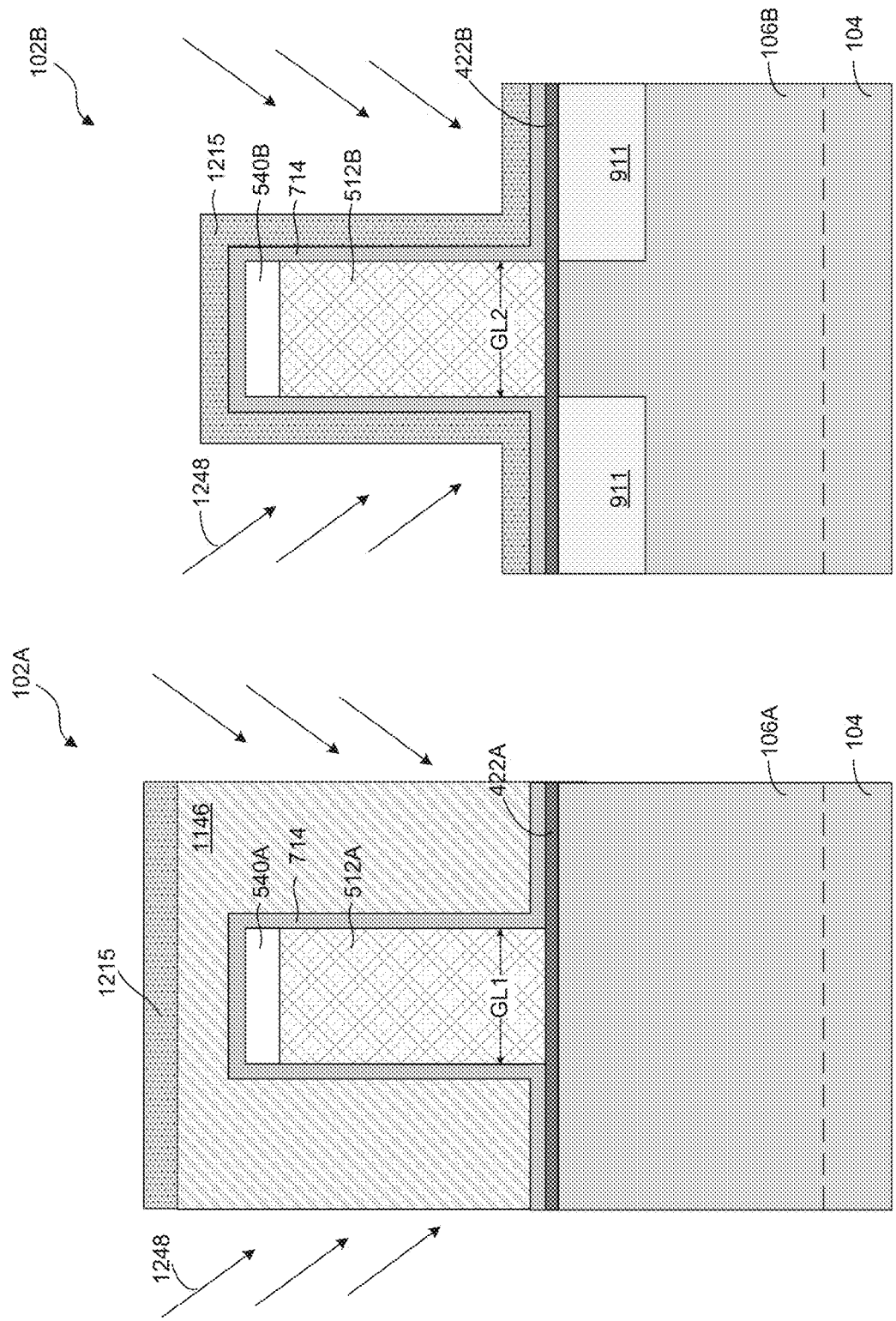

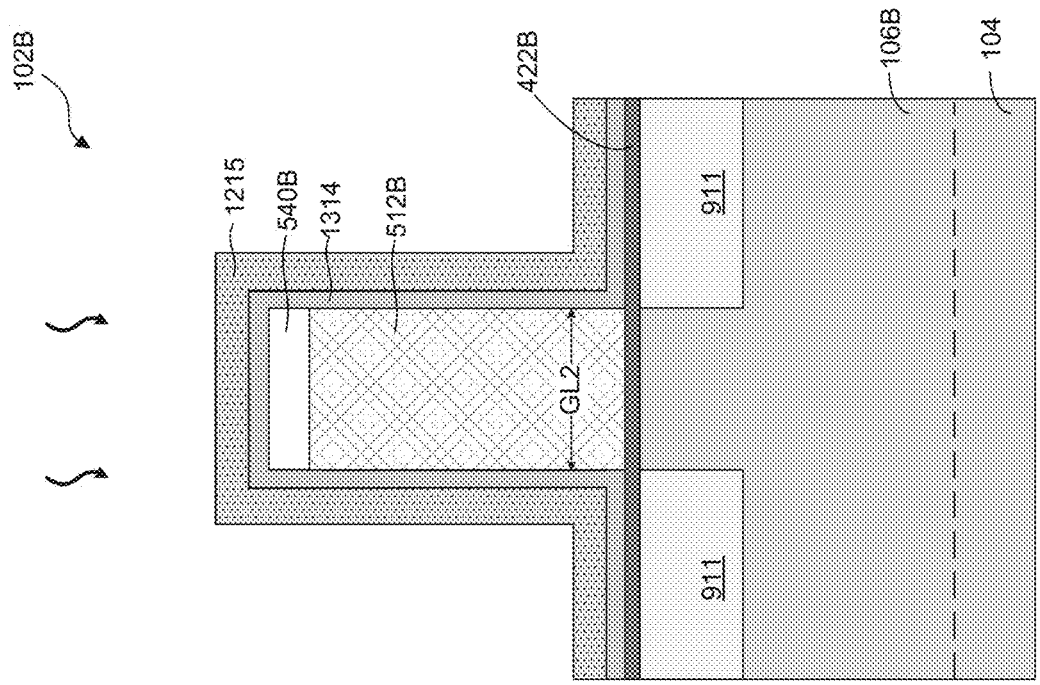
Fig. 13B
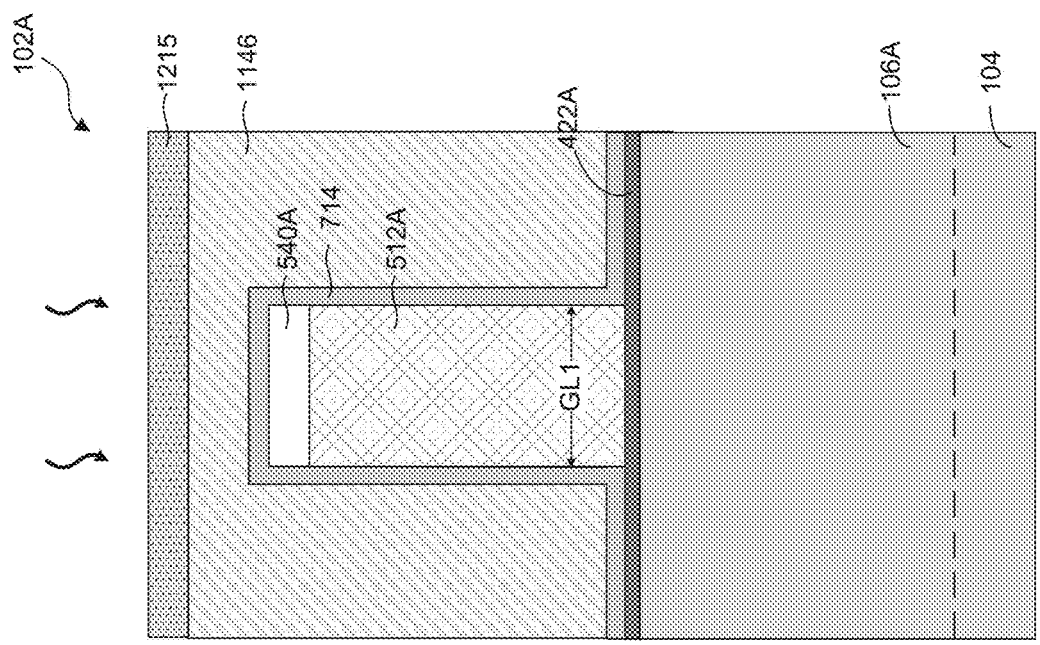
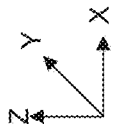
Fig. 13A

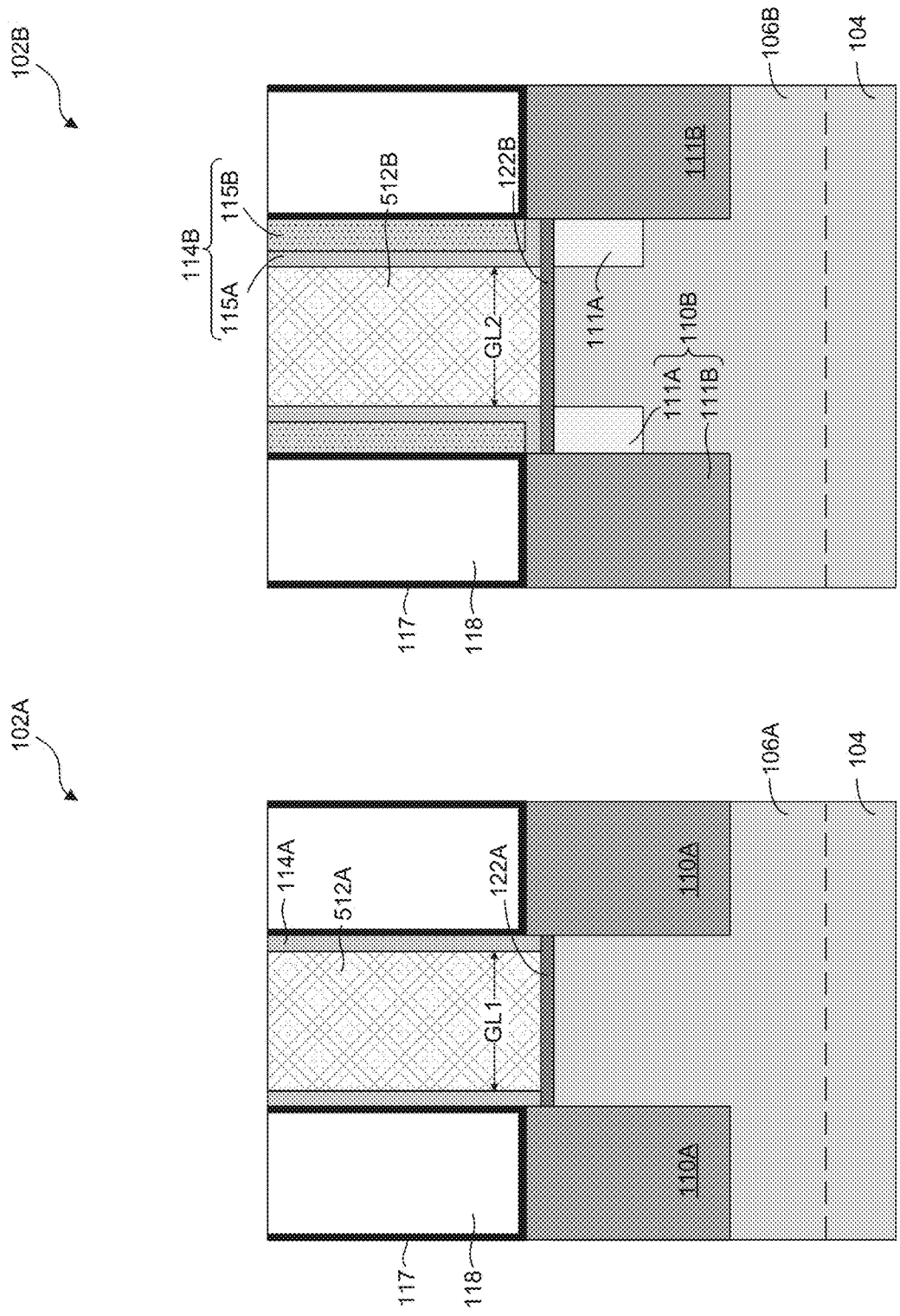

MULTI-FUNCTIONAL TRANSISTORS IN SEMICONDUCTOR DEVICES

CROSS-REFERENCE TO RELATED APPLICATIONS

This application claims the benefit of U.S. Provisional Patent Application No. 63/212,397, titled "Ion Implantation in Oxide Layers of FET Devices," filed Jun. 18, 2021, the disclosure of which is incorporated by reference herein in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs, fin field effect transistors (finFETs), and gate-all-around field effect transistors (GAA FETs). Such scaling down has increased the complexity of semiconductor manufacturing processes.

BRIEF DESCRIPTION OF THE DRAWINGS

Aspects of this disclosure are best understood from the following detailed description when read with the accompanying figures.

FIG. 1B-1E illustrate cross-sectional views of a semiconductor device with multi-functional transistors, in accordance with some embodiments.

FIGS. 3A-22B illustrate isometric views and cross-sectional views of a semiconductor device with multi-functional transistors at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1A:
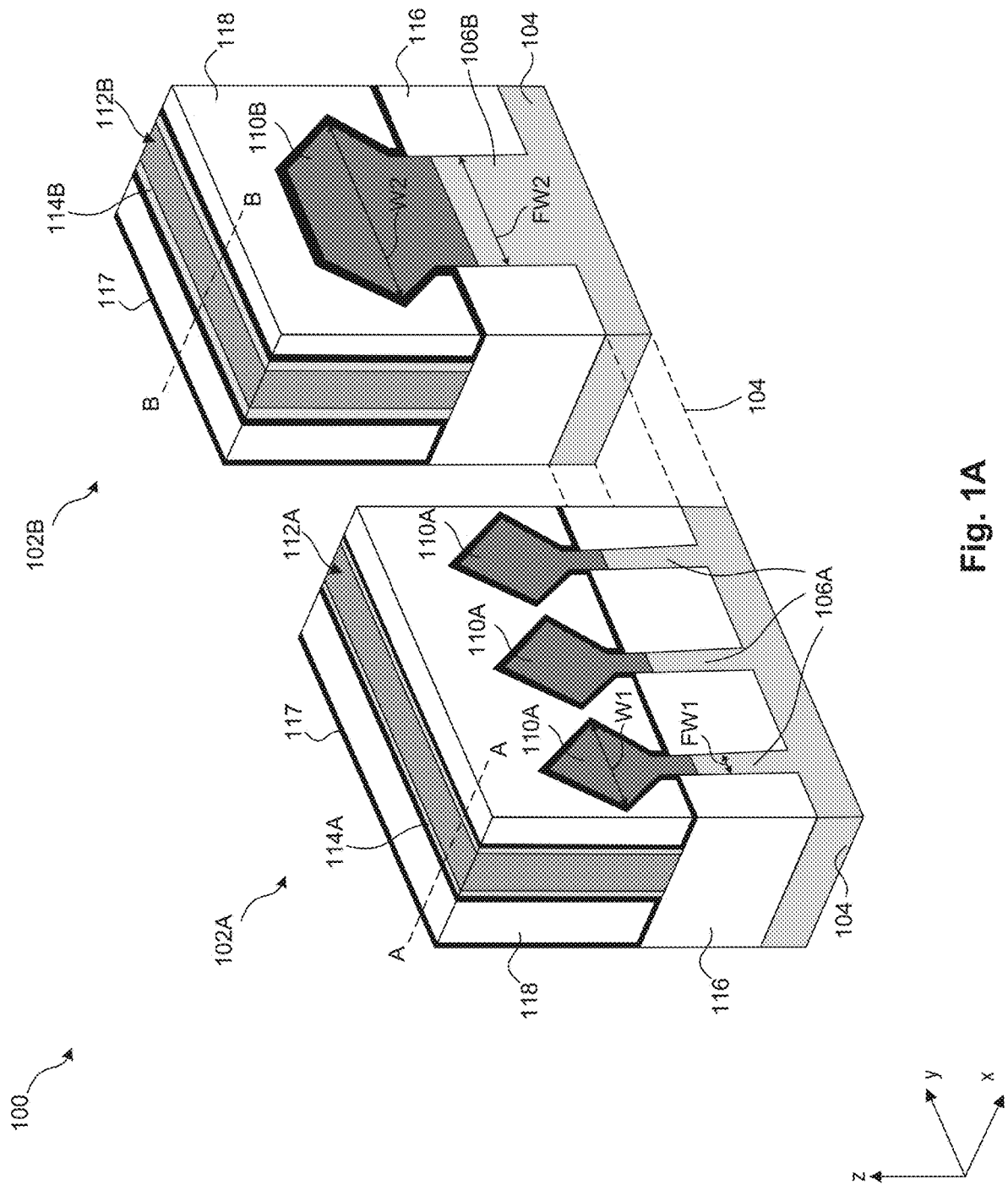
FIG. 1A illustrates an isometric view of a semiconductor device with multi-functional transistors, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

In some embodiments, the terms "about" and "substantially" can indicate a value of a given quantity that varies within 5% of the value (e.g., ±1%, ±2%, ±3%, ±4%, ±5% of the value). These values are merely examples and are not intended to be limiting. The terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Double-patterning or multi-patterning processes can combine photolithography and self-aligned processes, allowing patterns to be created that have, for example, pitches smaller than what is otherwise obtainable using a single, direct photolithography process. For example, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The required gate voltage—the threshold voltage (Vt)—to turn on a field effect transistor (FET) can depend on the semiconductor material of the FET channel region and/or the effective work function (EWF) value of a gate structure of the FET. For example, for an n-type FET (NFET), reducing the difference between the EWF value(s) of the NFET gate structure and the conduction band energy of the material (e.g., 4.1 eV for Si or 3.8 eV for SiGe) of the NFET channel region can reduce the NFET threshold voltage. For a p-type FET (PFET), reducing the difference between the EWF value(s) of the PFET gate structure and the valence band energy of the material (e.g., 5.2 eV for Si or 4.8 eV for SiGe) of the PFET channel region can reduce the PFET threshold voltage. The EWF values of the FET gate structures can depend on the thickness and/or material composition of the gate oxide layers of the FET gate structure. As such, FETs can be manufactured with different threshold voltages by adjusting the thickness and/or material composition of the FET gate structures.

Due to the increasing demand for multi-functional semiconductor devices, there is an increasing demand for FETs with different threshold voltages, such as non-input/output (non-I/O) FETs with threshold voltages between about 100 mV and about 200 mV (referred to as "low threshold voltage") and I/O FETs with threshold voltages between about 3 V and about 5 V (referred to as "high threshold voltage"). One way to achieve high and low threshold voltages in FETs can be with different gate oxide layer thicknesses in the FET gate structures. However, forming different gate structures with different gate oxide layer thicknesses during the gate replacement process can become increasingly challenging with the continuous scaling down of FETs (e.g., GAA FETs, finFETs, and/or MOSFETs).

The present disclosure provides example structures of semiconductor devices with FETs (e.g., finFETs or GAA FETs) having different gate structures to provide different threshold voltages, and example methods of forming such multi-Vt FETs on the same substrate. In some embodiments, the semiconductor device includes a non-I/O FET with a low threshold voltage and an I/O FET with a high threshold voltage. In some embodiments, the non-I/O FETs can be a core device, a logic device, or a memory device that is not configured to handle the input/output voltages/currents directly. In some embodiments, the gate oxide layer of the I/O FET can be thicker than the gate oxide layer of the non-I/O FET to achieve a higher threshold voltage in the I/O FET. In some embodiments, the gate oxide layers of the I/O and non-I/O FETs include non-thermal oxide layers with substantially equal thicknesses and the same materials. The gate oxide layer of the I/O FET additionally includes a thermal oxide layer to form the thicker gate oxide layer. In some embodiments, the metal gate layers of the I/O and non-I/O FETs have substantially equal thicknesses and the same materials. To reduce the complexities of forming the I/O and non-I/O FET gate structures in the same gate replacement process, the non-thermal oxide layers and the metal gate layers with similar thicknesses are formed substantially at the same time, whereas the thermal oxide layer of the I/O FET gate structure is formed in an oxidation process prior to the gate replacement process. As a result, the thickness of the thermal oxide layer can be individually controlled to tune the EWF value of the I/O FET gate structure, consequently adjusting the threshold voltage of the I/O FET without varying the gate layer thicknesses formed in the I/O and non-I/O FET gate structures during the gate replacement process.

The high threshold voltage of the I/O FET can require a higher bias voltage for the operation of the I/O FET than that required for the operation of the non-I/O FET. The high bias voltage can induce hot carrier effect at the interface between the gate oxide layer and the channel region near the heavily-doped source/drain (S/D) region of the I/O FET, resulting in the degradation of the gate structure and FET performance. To minimize or prevent the hot carrier effect, the channel region and the heavily-doped S/D regions are laterally separated from each other by lightly-doped S/D regions. In some embodiments, the widths of the lightly-doped S/D are defined by the overlying gate spacers along sidewalls of the I/O FET gate structure. In some embodiments, the gate spacers of the I/O FET can be thicker than the gate spacers of the non-I/O FET to form the underlying lightly-doped S/D region, which may not be included in the non-I/O FET.

Figures 1B, 1C:
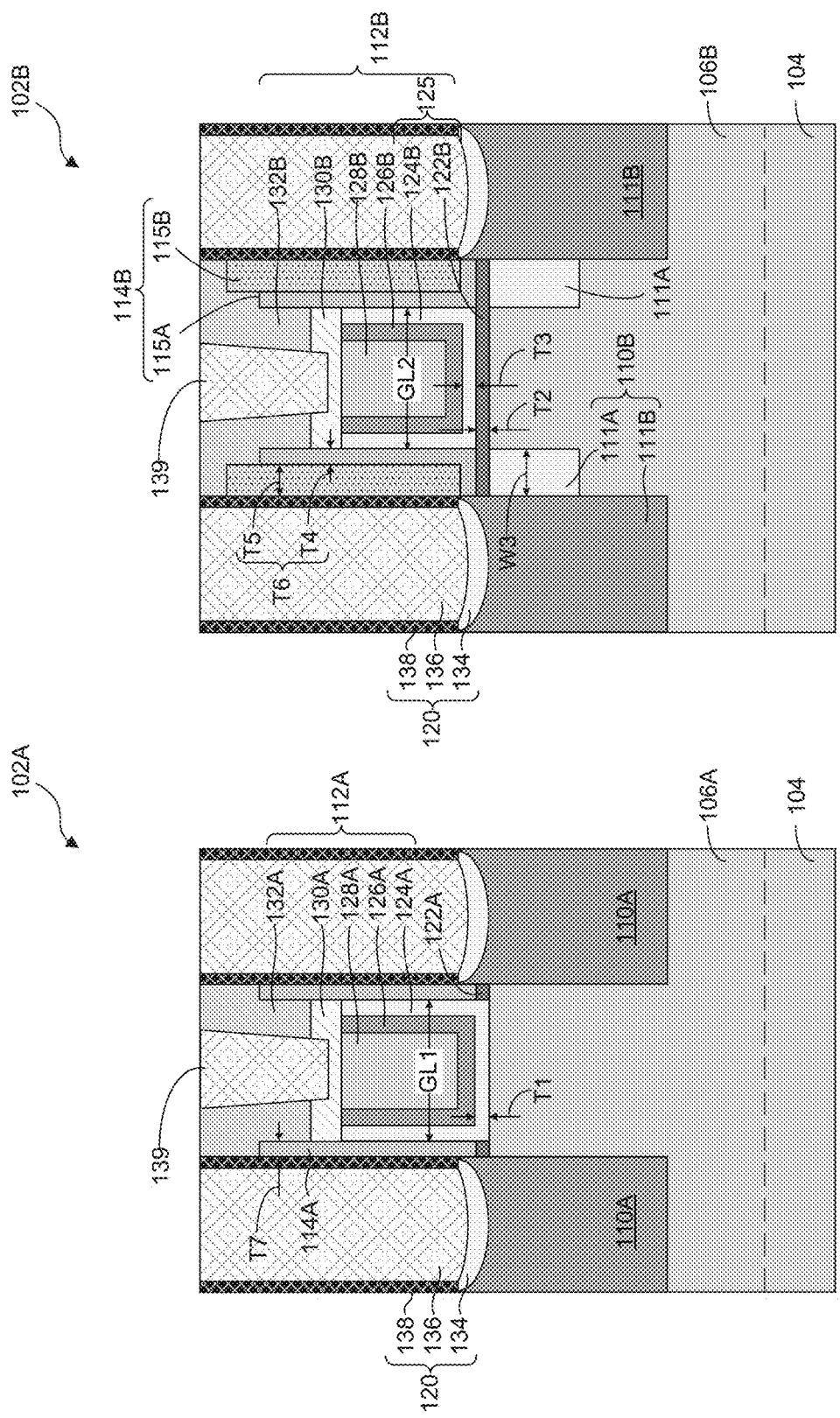

FIG. 1A illustrates an isometric view of a semiconductor device 100 with a FET 102A and a FET 102B, according to some embodiments. FIG. 1B illustrates a cross-sectional view of FET 102A along line A-A of FIG. 1A. FIG. 1C illustrates a cross-sectional view of FET 102B along line B-B of FIG. 1A. FIGS. 1B and 1C illustrate cross-sectional views of FET 102A and FET 102B, respectively, with additional structures that are not shown in FIG. 1A for simplicity. The discussion of elements with the same annotations applies to each other, unless mentioned otherwise. In some embodiments, FETs 102A-102B can represent n-type finFETs 102A-102B (NFETs 102A-102B) or p-type finFETs 102A-102B (PFETs 102A-102B) and the discussion of FETs 102A-102B applies to both NFET and PFET, unless mentioned otherwise.

Referring to FIGS. 1A and 1B, in some embodiments, FET 102A can be a non-I/O FET with a low threshold voltage and can be a logic device, a memory device, or any other device in a core device area that is not configured to handle the input/output voltages/currents directly. In some embodiments, FET 102A can include an array of fin structures 106A disposed on a substrate 104, a gate structure 112A disposed on fin structures 106A, gate spacers 114A disposed along sidewalls of gate structure 112A, an array of S/D regions 110A (also referred to as "heavily-doped S/D regions 110A") disposed in portions of fin structures 106A that are not covered by gate structure 112A, S/D contact structures 120 disposed on S/D regions 110A, and a gate contact structure 139 disposed on gate structure 112A. In some embodiments, fin structures 106A and gate structure 112A are electrically active and can be electrically coupled to power supplies through contact structures, such as S/D contact structures 120 and gate contact structure 139.

Referring to FIGS. 1A and 1C, in some embodiments, FET 102B can be an I/O FET with a high threshold voltage in a peripheral circuit area that is configured to handle the input/output voltages/currents directly. In some embodiments, FET 102B can include a fin structure 106B disposed on substrate 104, a gate structure 112B disposed on fin structure 106B, gate spacers 114B disposed along sidewalls of gate structure 112B, a S/D region 110B disposed in portions of fin structure 106B that is not covered by gate structure 112B, S/D contact structures 120 disposed on S/D regions 110B, and a gate contact structure 139 disposed on gate structure 112B. In some embodiments, fin structure 106B, and gate structure 112B are electrically active and can be electrically coupled to power supplies through contact structures, such as S/D contact structures 120 and gate contact structure 139.

In some embodiments, fin structure 106B can have a width FW2 greater than a width FW1 of one of fin structures 106A, and a ratio (FW1:FW2) between width FW1 and width FW2 can be about 1:2 to about 1:4. In some embodiments, S/D region 110B can have a width W2 greater than a width W1 of one of S/D regions 110A, and a ratio (W1:W2) between width W1 and width W2 can be about 1:2 to about 1:5. These relative dimensions of fin structures 106A-106B and S/D regions 110A-110B can provide FETs 102A-102B with structures for adequately operating as non-I/O FET 102A and I/O FET 102B without compromising the size and manufacturing cost of semiconductor device 100.

Semiconductor device 100 can be formed on a substrate 104 with FET 102A and FET 102B formed on different regions of substrate 104. There may be other FETs and/or structures (e.g., isolation structures) formed between FET 102A and FET 102B on substrate 104. Substrate 104 can be a semiconductor material, such as silicon, germanium (Ge), silicon germanium (SiGe), a silicon-on-insulator (SOI) structure, and a combination thereof. Further, substrate 104 can be doped with p-type dopants (e.g., boron, indium, aluminum, or gallium) or n-type dopants (e.g., phosphorus or arsenic). In some embodiments, fin structures 106A and 106B can include a material similar to substrate 104 and extend along an X-axis.

Semiconductor device 100 can further include shallow trench isolation (STI) regions 116, etch stop layer (ESL) 117, and interlayer dielectric (ILD) layer 118. ILD layer 118 can be disposed on ESL 117. ESL 117 can be configured to protect gate structures 112A-112B and/or S/D regions 110A-110B. In some embodiments, STI regions 116, ESL 117, and ILD layers 118 can include an insulating material, such as silicon oxide, silicon nitride (SiN), silicon carbon nitride (SiCN), silicon oxycarbon nitride (SiOCN), and silicon germanium oxide.

Referring to FIGS. 1B-1C, gate structures 112A and 112B can be multi-layered structures. In some embodiments, gate structure 112A can include: a gate oxide layer 124A disposed on fin structure 106A; a work function metal (WFM) layer 126A disposed on gate oxide layer 124A; a gate metal fill layer 128A disposed on WFM layer 126A; a conductive capping layer 130A disposed on gate oxide layer 124A, WFM layer 126A, and gate metal fill layer 128A; and insulating capping layer 132A disposed on conductive capping layer 130A. Similarly, gate structure 112B can include: a gate oxide layer 125 disposed on fin structure 106B; a work function metal (WFM) layer 126B disposed on gate oxide layer 124B; a gate metal fill layer 128B disposed on WFM layer 126B; a conductive capping layer 130B disposed on gate oxide layer 124B, WFM layer 126B, and gate metal fill layer 128B; and insulating capping layer 132B disposed on conductive capping layer 130B. In some embodiments, the stacks of WFM layer 126A-126B and gate metal fill layer 128A-128B of gate structures 112A-112B can be referred to as a "metal gate stacks" of gate structures 112A-112B. In some embodiments, gate structures 112A and 112B can have gate lengths GL1 and GL2 that are substantially equal to each other.

Referring to FIG. 1B, in some embodiments, gate oxide layer 124A can include a non-thermal oxide layer. That is, gate oxide layer 124A is not formed by oxidizing the portion of fin structure 106A under gate structure 112A. In some embodiments, the non-thermal oxide layer can include a high-k dielectric material, such as hafnium oxide ($HfO_2$), titanium oxide ($TiO_2$), hafnium zirconium oxide (HfZrO), tantalum oxide ($Ta_2O_3$), zirconium oxide ($ZrO_2$), and zirconium silicate ($ZrSiO_2$), and can have a thickness T1 of about 0.5 nm to about 4 nm. Within this thickness range of gate oxide layer 124A, adequate electrical isolation between gate structure 112A and channel regions in fin structures 106A can be provided to achieve the low threshold voltage without compromising the size and manufacturing cost of semiconductor device 100.

Referring to FIG. 1C, in some embodiments, gate oxide layer 125 can include a thermal oxide layer 122B and a non-thermal oxide layer 124B. Thermal oxide layer 122B can include an oxide of the semiconductor material of fin structure 106B, such as silicon oxide ($SiO_x$) and silicon germanium oxide ($Si_xGe_{1-x}O_y$). In some embodiments, non-thermal oxide layer 124B can include a high-k dielectric material, such as $HfO_2$, $TiO_2$, HfZrO, $Ta_2O_3$, $ZrO_2$, and $ZrSiO_2$. In some embodiments, thermal oxide layer 122B and non-thermal oxide layer 124B can include dielectric materials different from each other. In some embodiments, gate oxide layer 124A and non-thermal oxide layer 124B can include the same dielectric material. In some embodiments, thermal oxide layer 122B can have a thickness T2 of about 0.5 nm to about 4 nm, and non-thermal oxide layer 124B can have a thickness T3 of about 0.5 nm to about 4 nm. In some embodiments, a ratio (T3:T2) between thickness T3 and thickness T2 can be about 1:1 to about 1:2. Within these thickness ranges of gate oxide layer 125, adequate electrical isolation between gate structure 112B and a channel region in fin structure 106B can be provided to achieve the high threshold voltage without compromising the size and manufacturing cost of semiconductor device 100.

In some embodiments, thickness T1 and thickness T3 can be substantially equal to each other as gate oxide layer 124A and non-thermal oxide layer 124B are formed substantially at the same time during the same gate replacement process, as described in detail below. Though thickness T1 and thickness T3 can be substantially equal, the total thickness (T2+T3) of gate oxide layer 125 is greater than thickness T1 of gate oxide layer 124A, and the total thickness can be varied by varying thickness T2 of thermal oxide layer 122B, which can be formed in an oxidation process prior to the gate replacement process. As a result, the higher threshold voltage of gate structure 112B compared to the threshold voltage of gate structure 112A can be achieved while using the same gate replacement process for the formation of gate structures 112A and 112B.

Referring to FIGS. 1B-1C, in some embodiments, WFM layers 126A and 126B of NFET gate structures 112A and 112B can include titanium aluminum (TiAl), titanium aluminum carbide (TiAlC), tantalum aluminum (TaAl), tantalum aluminum carbide (TaAlC), Al-doped Ti, Al-doped TiN, Al-doped Ta, Al-doped TaN, other suitable Al-based materials., or a combination thereof. In some embodiments, WFM layers 126A and 126B of PFET gate structures 112A and 112B can include substantially Al-free (e.g., with no Al) Ti-based or Ta-based nitrides or alloys, such as titanium nitride (TiN), titanium silicon nitride (TiSiN), titanium gold (Ti—Au) alloy, titanium copper (Ti—Cu) alloy, tantalum nitride (TaN), tantalum silicon nitride (TaSiN), tantalum gold (Ta—Au) alloy, tantalum copper (Ta—Cu), and a combination thereof. In some embodiments, gate metal fill layers 128A and 128B can include a suitable conductive material, such as tungsten (W), Ti, silver (Ag), ruthenium (Ru), molybdenum (Mo), copper (Cu), cobalt (Co), Al, iridium (Ir), nickel (Ni), metal alloys, and a combination thereof. In some embodiments, thicknesses of WFM layers 126A and 126B are substantially equal to each other and thicknesses of gate metal fill layers 128A and 128B are substantially equal to each other.

Insulating capping layers 132A and 132B protect the underlying conductive capping layers 130A and 130B from structural and/or compositional degradation during subsequent processing of the semiconductor device. In some embodiments, insulating capping layer 132A and 132B can include a nitride material, such as silicon nitride, and can have a thickness of about 5 nm to about 10 nm for adequate protection of the underlying conductive capping layers 130A and 130B. Conductive capping layers 130A and 130B provide conductive interfaces between gate contact structures 139 and gate metal fill layers 128A and 128B to electrically connect the metal gate stacks of gate structures 112A and 112B to gate contact structures 139 without forming gate contact structures 140 directly on or within the metal gate stacks. Gate contact structures 139 are not formed directly on or within the metal gate stacks to prevent contamination of the metal gate stacks by any of the processing materials used in the formation of gate contact structures 139. Contamination of the metal gate stacks can lead to the degradation of device performance. Thus, with the use of conductive capping layers 130A and 130B, the metal gate stacks can be electrically connected to gate contact structures 140 without compromising the integrity of gate structures 112A and 112B. In some embodiments, conductive capping layers 130A and 130B and gate contact structures 139 can include a metallic material, such as W, Ru, Ir, Mo, other suitable metallic materials, and a combination thereof. In some embodiments, conductive capping layers 130A and 130B and gate contact structures 139 can have the same metallic material or can have metallic materials different from each other. In some embodiments, thicknesses of insulating capping layer 132A and 132B are substantially equal to each other and thicknesses of conductive capping layers 130A and 130B are substantially equal to each other.

Referring to FIG. 1B, in some embodiments, for NFET 102A, each of heavily-doped S/D regions 110A can include an epitaxially-grown semiconductor material, such as Si, and n-type dopants, such as phosphorus and other suitable n-type dopants. In some embodiments, for PFET 102A, each of heavily-doped S/D regions 110A can include an epitaxially-grown semiconductor material, such as Si and SiGe, and p-type dopants, such as boron and other suitable p-type dopants. In some embodiments, dopant concentration in heavily-doped S/D regions 110A can be about $10^{19}$ atoms/cm$^3$ to about $10^{21}$ atoms/cm$^3$.

Referring to FIG. 1C, in some embodiments, each of S/D regions 110B can include a lightly-doped S/D region 111A and a heavily-doped S/D region 111B. Each of lightly-doped S/D regions 111A can be disposed within the portion fin structure 106B under gate spacer 114B, and between heavily-doped S/D region 111B and the portion of fin structure 106B under gate structure 112B that includes the channel region. Lightly-doped S/D regions 111A can prevent or minimize hot carrier effects in the channel region. The hot carrier effects can be due to the high bias voltage applied during the operation of FET 102B for the high threshold voltage.

In some embodiments, width W3 of each lightly-doped S/D region 111A can be defined by thickness T6 of gate spacer 114B. Thickness T6 can be greater than thickness T7 of gate spacers 114A (FIG. 1B), as lightly-doped S/D regions may not be formed in fin structures 106A. In some embodiments, a ratio (T7:T6) between thickness T7 and thickness T6 can be about 1:2 to about 1:4. In some embodiments, each of lightly-doped S/D regions 111A can include a dopant concentration of about $10^{16}$ atoms/cm$^3$ to about $10^{18}$ atoms/cm$^3$. In some embodiments, heavily-doped S/D regions 111B can include an epitaxially-grown semiconductor material and dopant concentrations similar to heavily-doped S/D regions 110A.

Referring to FIG. 1C, each of gate spacers 114B can include a nitride spacer 115A with a thickness T4 disposed along sidewalls of gate structure 112B and an oxide spacer 115B with a thickness T5 disposed on nitride spacer 115A. In some embodiments, nitride spacer 115A can include silicon nitride ($SiN_x$) and may not include an oxide material. In some embodiments, oxide spacer 115B can include silicon oxide ($SiO_x$) and may not include a nitride material. A ratio (T4:T5) between thickness T4 and thickness T5 can be about 1:1 to about 1:3. Within these relative thickness ranges of nitride spacer 115A and oxide spacer 115B, widths W3 of lightly-doped S/D regions 111A can be adequately defined to minimize or prevent hot carrier effects in the channel region of FET 102B and consequently prevent degradation of gate oxide layer 125. In some embodiments, gate spacers 114A and nitride spacers 115A can have the same material. The material of nitride spacers 115A can have a higher density than the material of gate spacers 114A. The higher density of nitride spacers 115A can provide greater chemical stability to withstand the high bias voltage applied during the operation of FET 102B for the high threshold voltage.

Referring to FIGS. 1B-1C, in some embodiments, S/D contact structures 120 can include silicide layers 134 disposed on S/D regions 110A and 110B, contact plugs 136 disposed on silicide layers 134, and nitride barrier layers 138 along sidewalls of contact plugs 136. In some embodiments, silicide layers 134 can include titanium silicide ($Ti_xSi_y$), tantalum silicide ($Ta_xSi$), molybdenum silicide ($Mo_xSi_y$), nickel silicide ($Ni_xSi_y$), cobalt silicide ($Co_xSi_y$), tungsten silicide ($W_xSi_y$), or a combination thereof. In some embodiments, contact plugs 136 can include conductive materials, such as cobalt (Co), tungsten (W), ruthenium (Ru), iridium (Ir), nickel (Ni), osmium (Os), rhodium (Rh), aluminum (Al), molybdenum (Mo), copper (Cu), zirconium (Zr), stannum (Sn), silver (Ag), gold (Au), zinc (Zn), cadmium (Cd), and a combination thereof.

Referring to FIGS. 1D-1E, in some embodiments, FET 102A can be a GAA FET 102A instead of finFET 102A (shown in FIG. 1B) and FET 102B can be a finFET 102B. For GAA FET 102A, gate structure 112A can have a cross-sectional view as shown in FIG. 1D. Gate structure 112A can be wrapped around nanostructured channel regions 121. As used herein, the term "nanostructured" defines a structure, layer, and/or region as having a horizontal dimension (e.g., along an X- and/or Y-axis) and/or a vertical dimension (e.g., along a Z-axis) less than about 100 nm, for example about 90 nm, about 50 nm, about 10 nm, or other values less than about 100 nm.

Nanostructured channel regions 121 can include semiconductor materials similar to or different from substrate 104. In some embodiments, nanostructured channel regions 121 can include Si, SiAs, silicon phosphide (SiP), SiC, SiCP, SiGe, silicon germanium boron (SiGeB), germanium boron (GeB), silicon germanium stannum boron (SiGeSnB), a III-V semiconductor compound, or other suitable semiconductor materials. Though rectangular cross-sections of nanostructured channel regions 121 are shown, nanostructured channel regions 121 can have cross-sections of other geometric shapes (e.g., circular, elliptical, triangular, or polygonal). Gate portions of gate structure 112A surrounding nanostructured channel regions 121 can be electrically isolated from adjacent S/D regions 110A by inner spacers 113. Inner spacers 113 can include an insulating material, such as $SiO_x$, SiN, SiCN, SiOCN, and other suitable insulating materials.

Figure 2:
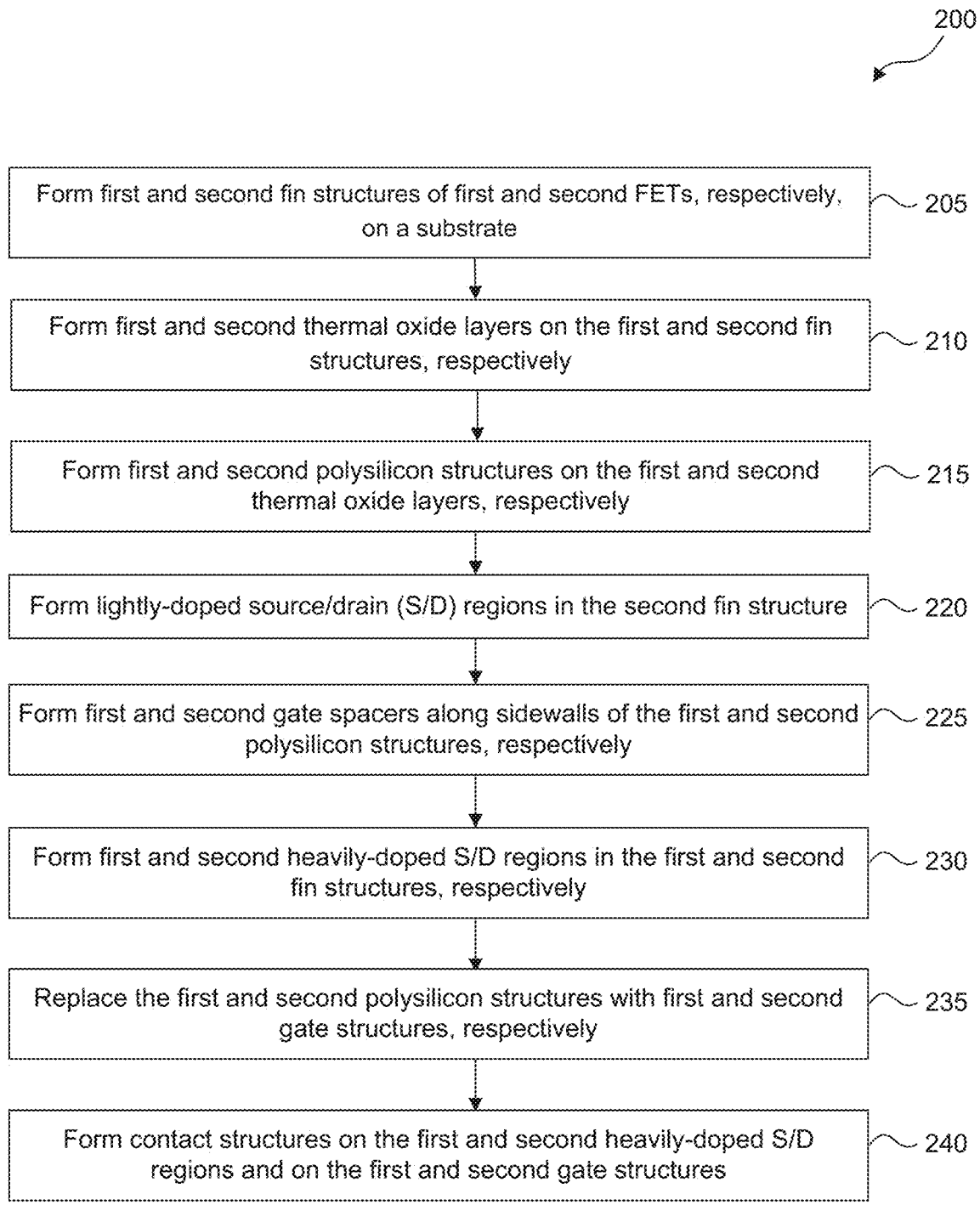
FIG. 2 is a flow diagram of a method for fabricating a semiconductor device with multi-functional transistors, in accordance with some embodiments.

FIG. 2 is a flow diagram of an example method 200 for fabricating FET 102A and FET 102B with cross-sectional views shown in FIGS. 1B and 1C, according to some embodiments. For illustrative purposes, the operations illustrated in FIG. 2 will be described with reference to the example fabrication process for fabricating FETs 102A-102B as illustrated in FIGS. 3A-22B. FIGS. 3A-5A are isometric views, and FIGS. 6A-22A are cross-sectional views of FET 102A along line A-A of FIG. 1A at various stages of fabrication, according to some embodiments. FIGS. 3B-5B are isometric views, and FIGS. 6B-22B are cross-sectional views of FET 102B along line B-B of FIG. 1A at various stages of fabrication, according to some embodiments. Operations can be performed in a different order or not performed depending on specific applications.

It should be noted that method 200 may not produce a complete FET 102A and a complete FET 102B. Accordingly, it is understood that additional processes can be provided before, during, and after method 200, and that some other processes may only be briefly described herein. Elements in FIGS. 3A-22B with the same annotations as elements in FIGS. 1A-1C are described above.

In operation 205, first and second fin structures of first and second FETs, respectively, are formed on a substrate. For example, as shown in FIGS. 3A-3B, fin structures 106A and 106B of FETs 102A and 102B are formed on substrate 104. The formation of fin structures 106A and 106B can include sequential operations of (i) forming a patterned masking layer (not shown) on substrate 104, and (ii) etching substrate 104 to form the structures of FIGS. 3A-3B. After the formation of fin structures 106A and 106B, STI regions 116 can be formed as shown in FIGS. 3A-3B.

Figure 4B:
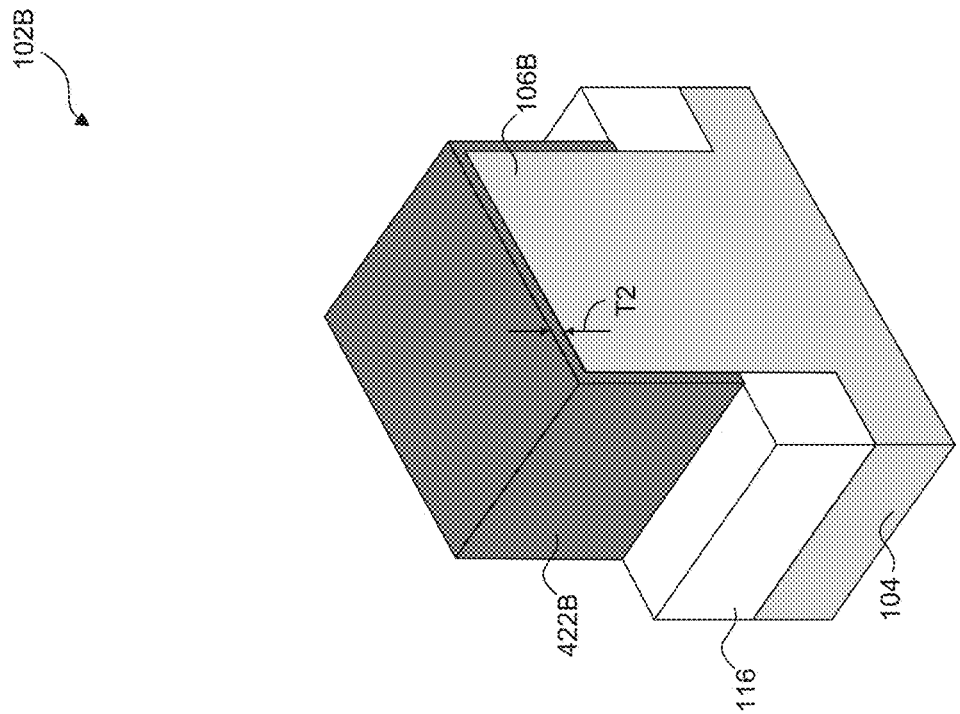
Figure 4A:
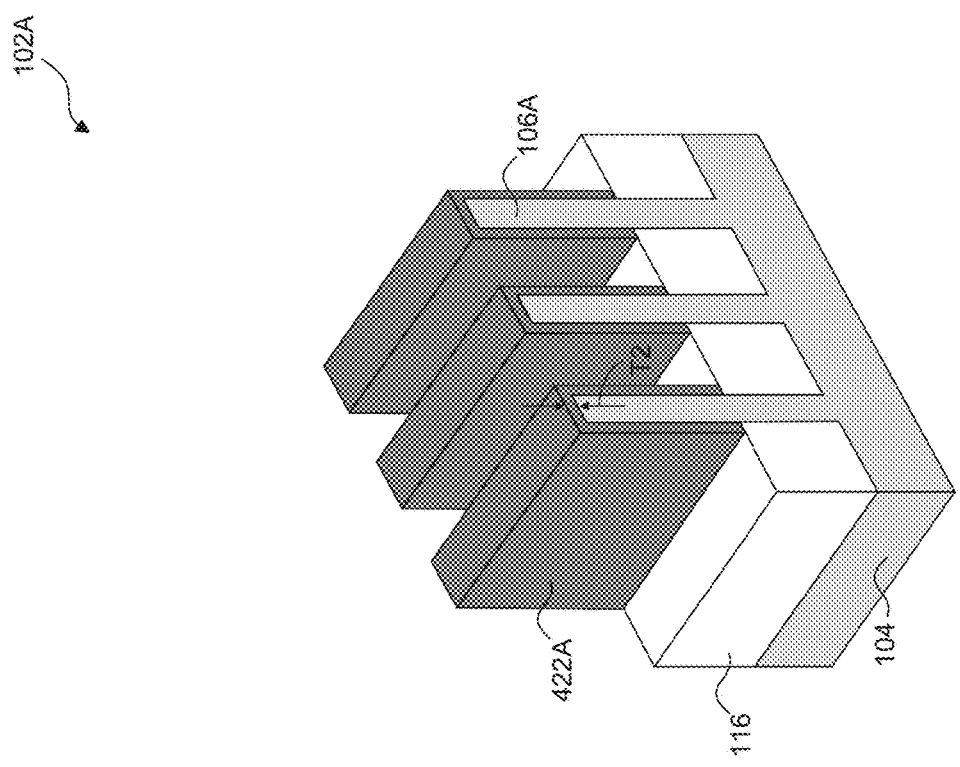
Figure 5B:
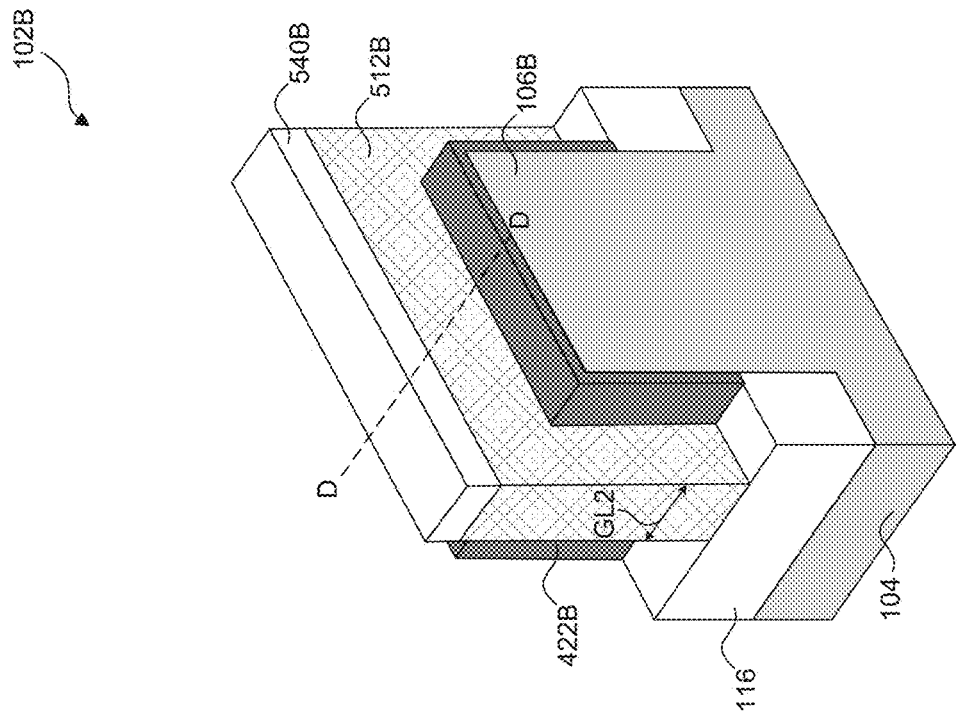
Figure 5A:
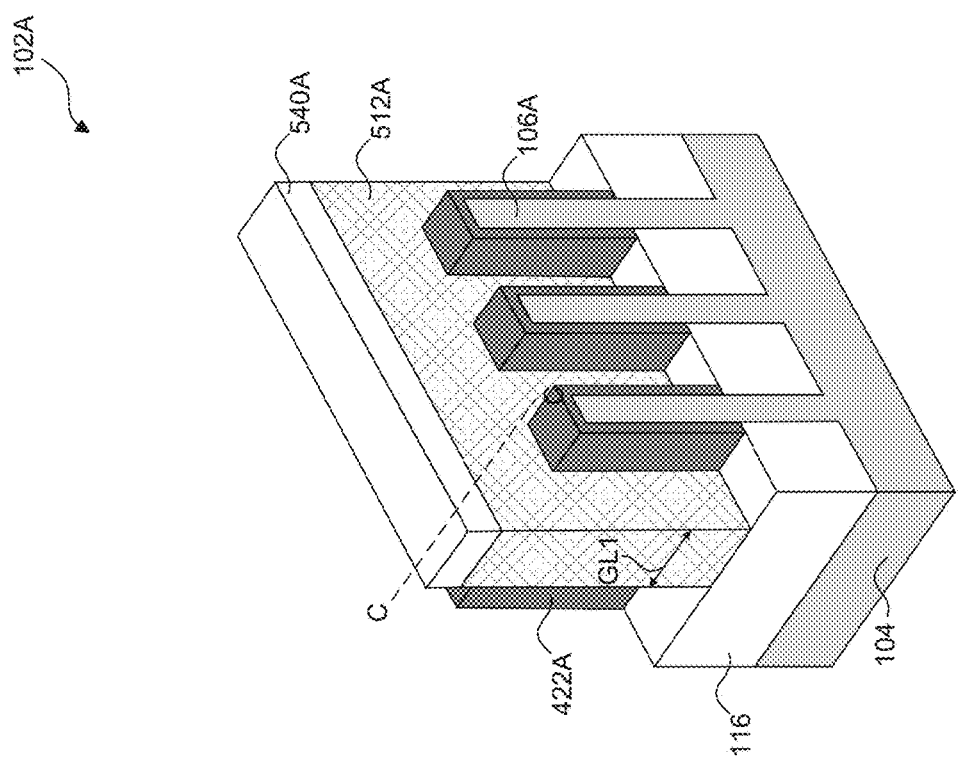

Referring to FIG. 2, in operation 210, first and second thermal oxide layers are formed on the first and second fin structures, respectively. For example, as shown in FIGS. 4A-4B, thermal oxide layers 422A and 422B with a thickness T2 are formed on fin structures 106A and 106B, respectively. Thermal oxide layers 422A and 422B can be formed in a thermal oxidation process. In some embodiments, the thermal oxidation process can include oxidizing the surfaces of fin structures 106A and 106B that are exposed above STI regions 116 in an oxidizing ambient at a temperature of about 30° C. to about 200° C. or at other suitable oxidation temperatures. In some embodiments, the oxidizing ambient can include a combination of ozone ($O_3$), a mixture of ammonia hydroxide, hydrogen peroxide, and water, and/or a mixture of hydrochloric acid, hydrogen peroxide, and water. In some embodiments, the thermal oxidation process can include oxidizing the surfaces of fin structures 106A and 106B that are exposed above STI regions 116 in an oxygen ambient or in a steam and oxygen ambient at a temperature of about 400° C. to about 600° C.

Figure 6B:
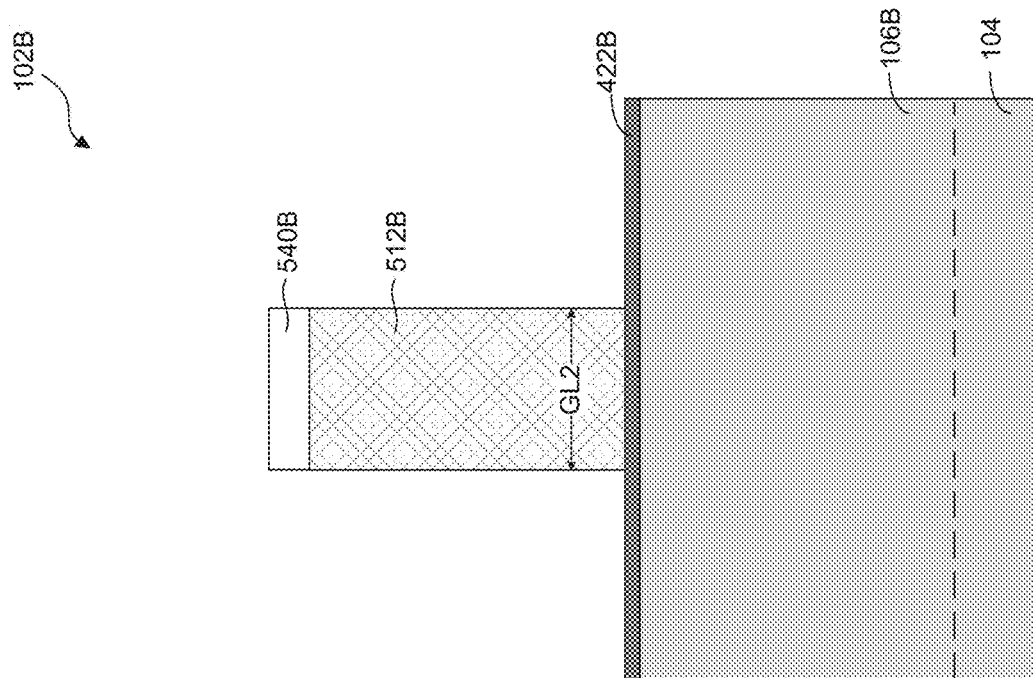
Figure 6A:
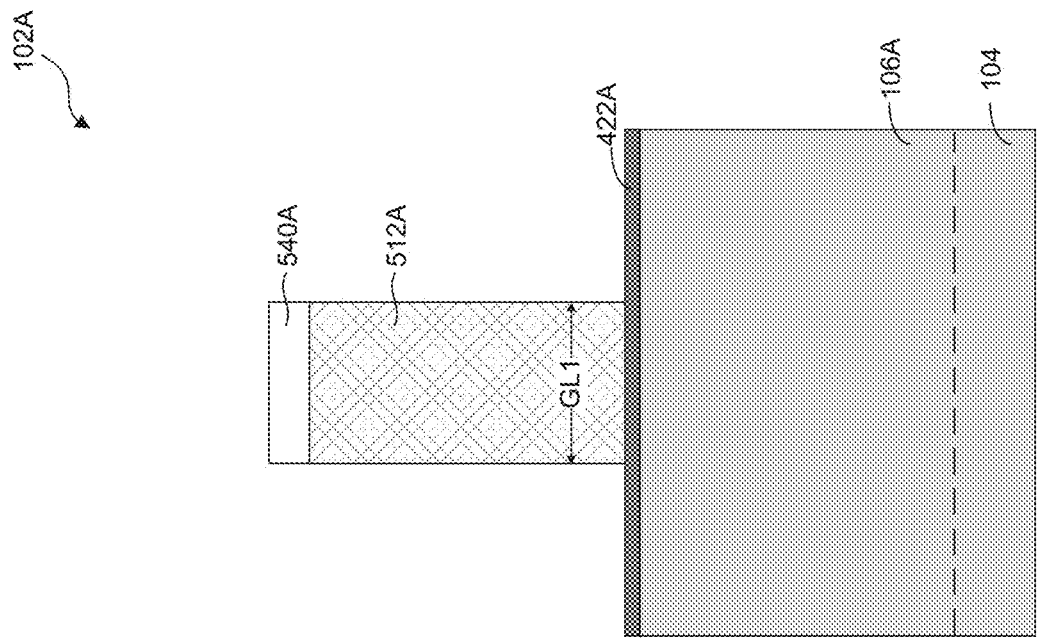
Figure 7B:
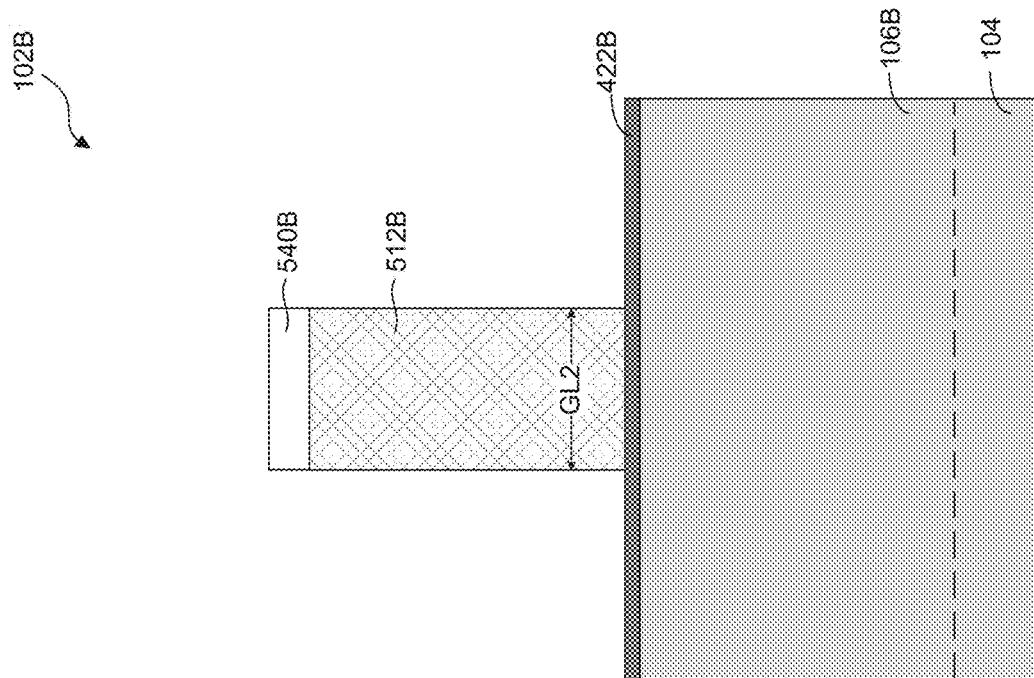
Figure 7A:
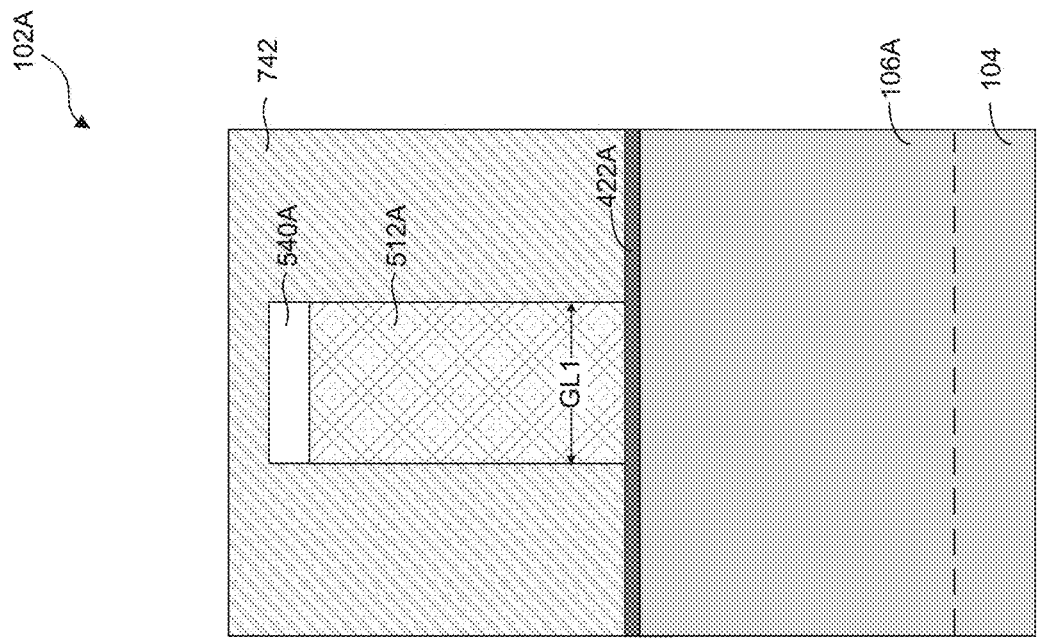

Referring to FIG. 2, in operation 215, first and second polysilicon structures are formed on the first and second thermal oxide layers. For example, as shown in FIGS. 5A-6B, polysilicon structures 512A and 512B are formed on thermal oxide layers 422A and 422B, respectively. FIG. 6A is a cross-sectional view of FIG. 5A along line A-A, and FIG. 6B is a cross-sectional view of FIG. 5B along line B-B. In some embodiments, hard mask layers 540A and 540B can be formed on polysilicon structures 512A and 512B, respectively, to prevent or minimize the etching of polysilicon structures 512A and 512B during the formation of gate spacers 114A and 114B in subsequent operation 225.

Figures 9A, 9B:
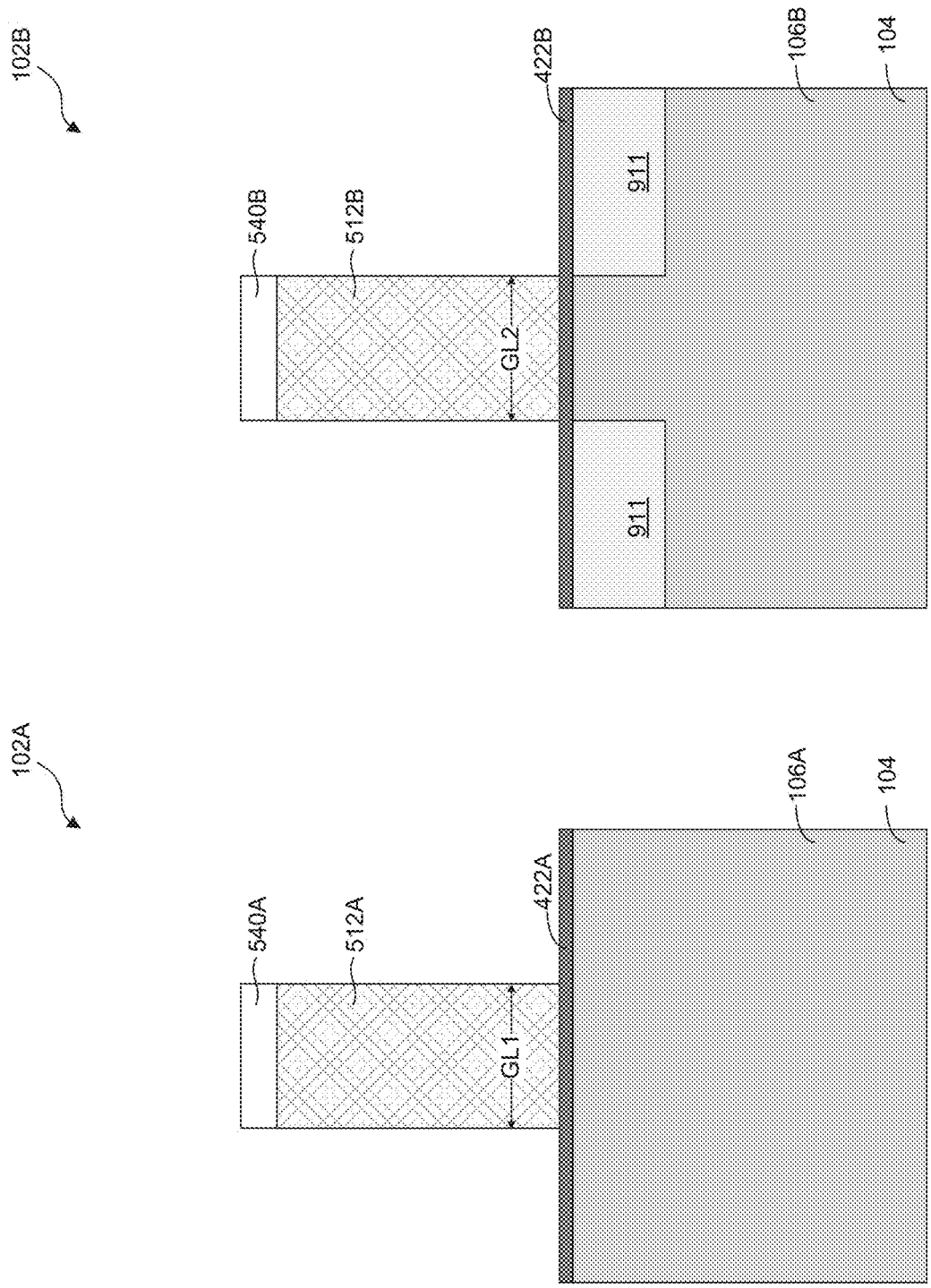
Figure 10B:
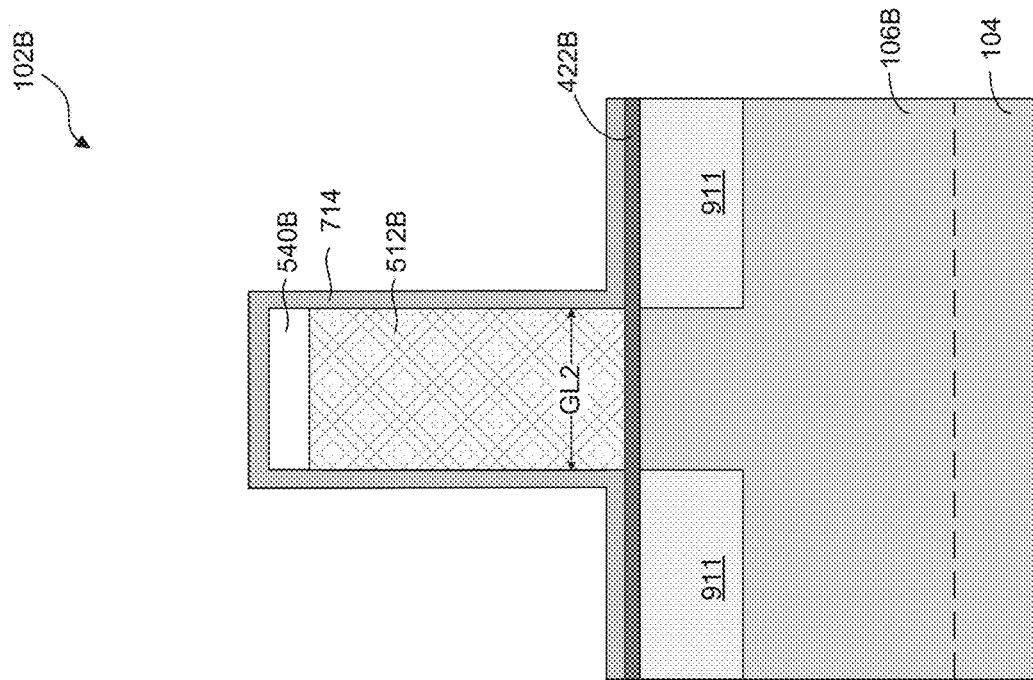
Figure 10A:
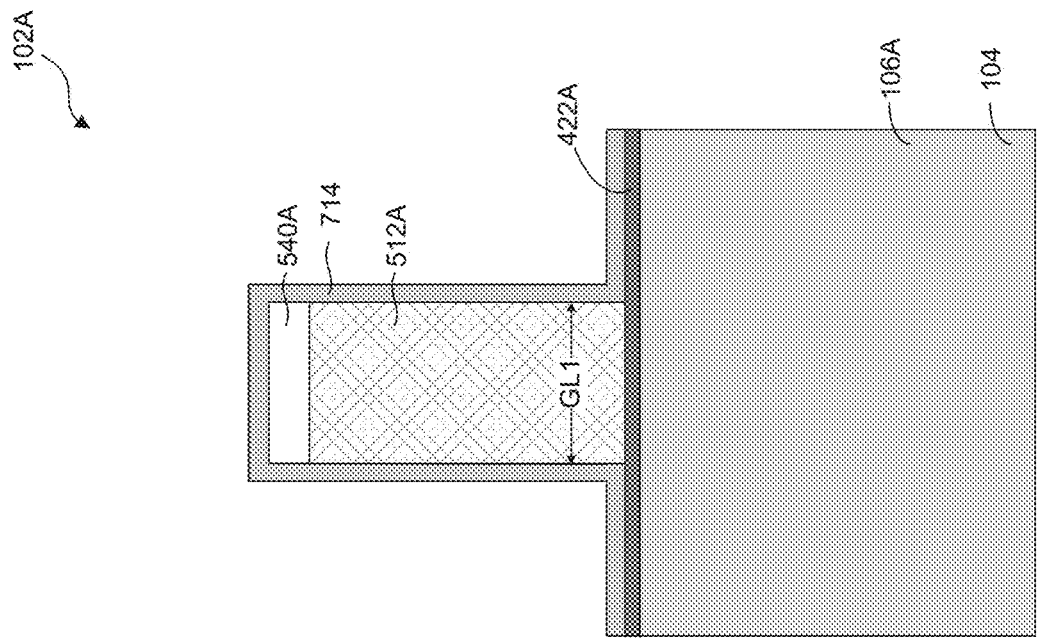

Referring to FIG. 2, in operation 220, lightly-doped S/D regions are formed in the second fin structure. For example, as described with reference to FIGS. 7A-9B, lightly-doped S/D regions 911A are formed in fin structure 106A. The formation of lightly-doped S/D regions 911A can include sequential operations of (i) forming a masking layer 742 selectively on the structure of FIG. 6A to form the structure of FIG. 7A, (ii) performing an ion implantation process with dopants 844, as shown in FIGS. 8A-8B, to dope the portions of fin structure 106B that are uncovered by polysilicon structure 512B, as shown in FIG. 9B, and (iii) removing masking layer 742, as shown in FIG. 9A.

Figure 14B:
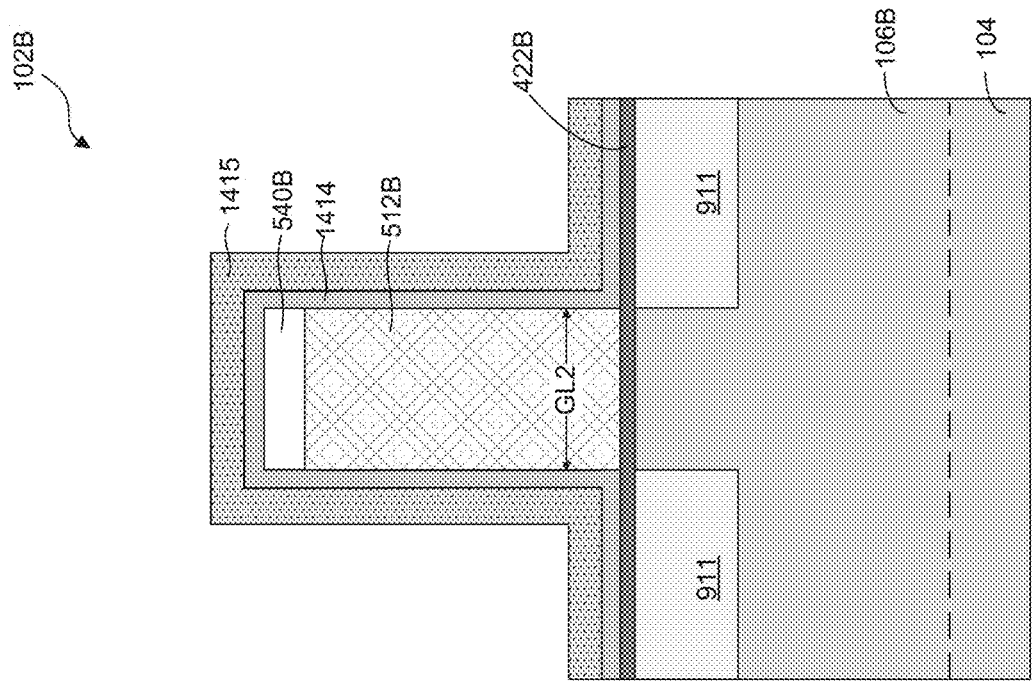
Figure 14A:
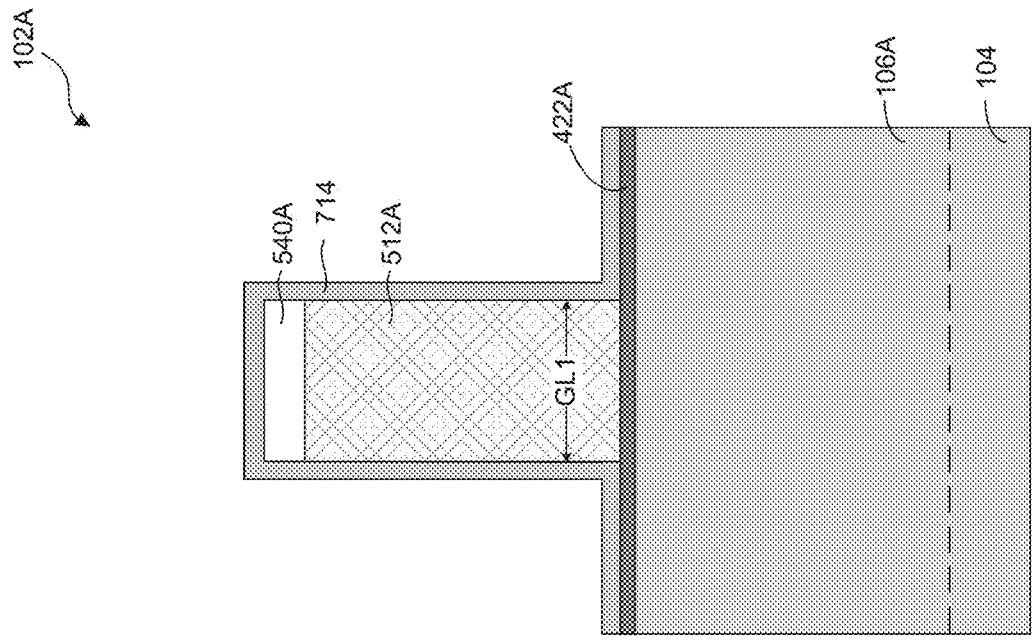
Figures 15A, 15B:
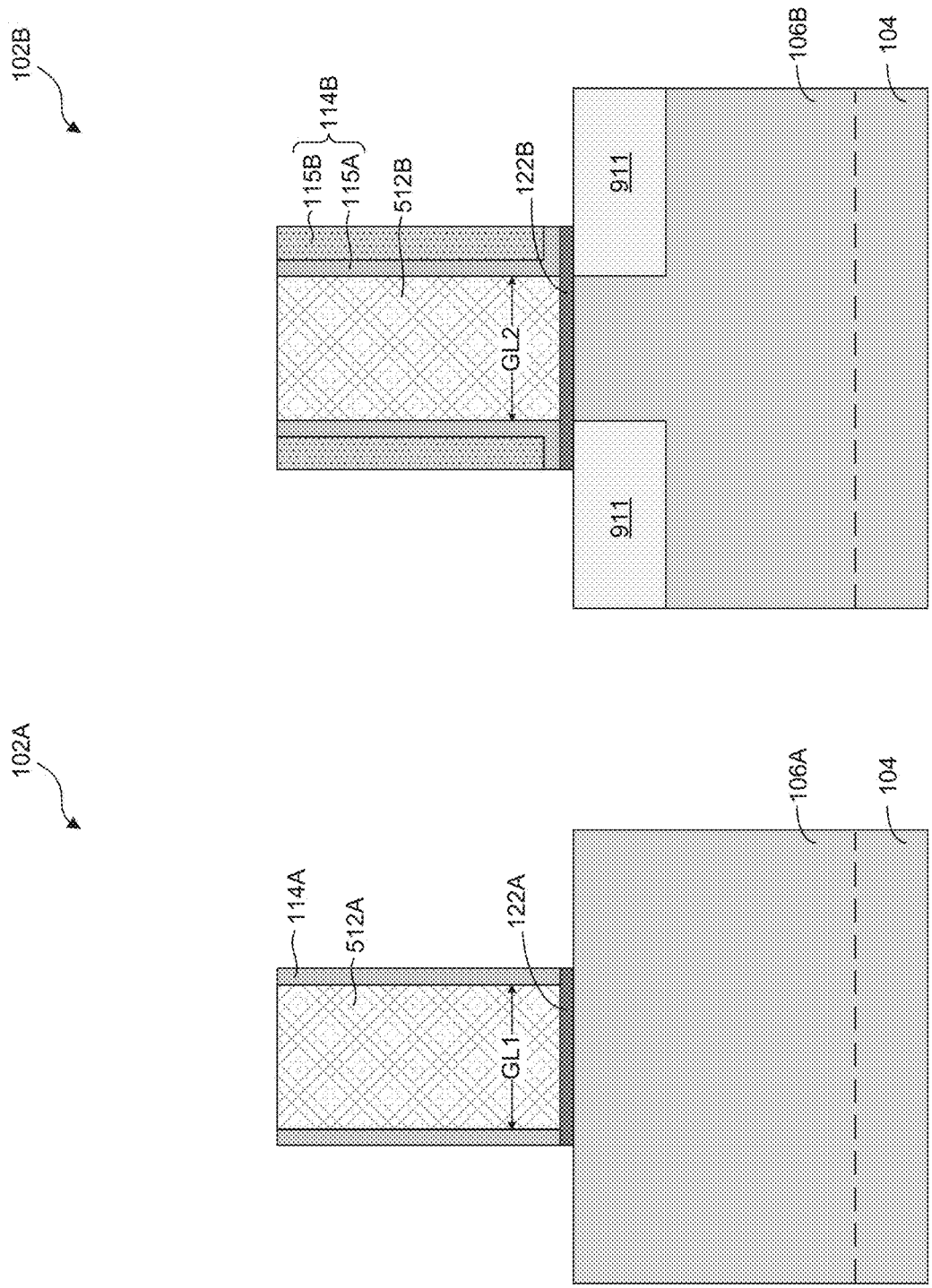

Referring to FIG. 2, in operation 225, first and second gate spacers are formed along sidewalls of the first and second polysilicon structures, respectively. For example, as described with reference to FIGS. 10A-15B, gate spacers 114A and 114B are formed along sidewalls of polysilicon structures 512A and 512B, respectively. The formation of gate spacers 114A and 114B can include sequential operations of (i) depositing a nitride layer 714 on the structures of FIGS. 9A-9B to form the structures of FIGS. 10A-10B, (ii) forming a masking layer 1146 selectively on the structure of FIG. 10A to form the structure of FIG. 11A, (iii) depositing an oxide layer 1215 on the structures of FIGS. 11A-11B to form the structures of FIGS. 12A-12B, (iv) performing an ion implantation process with fluorine ions 1024 on the structures of FIGS. 12A-12B to form a fluorine-doped nitride layer 1314, as shown in FIG. 13B, (v) performing an anneal process on the structures of FIGS. 13A-13B to form densified fluorine-doped nitride layer 1414, as shown in FIG. 14B, (vi) removing masking layer 1146 from the structure of FIG. 13A to form the structure of FIG. 14A, (vii) etching portions of oxide layer 1215 to form oxide spacer 115B, as shown in FIG. 15B, (viii) etching portions of nitride layer 714 and portions of densified fluorine-doped nitride layer 1414 exposed after etching of oxide layer 1215 to form the structures of FIGS. 15A-15B.

In some embodiments, the ion implantation process with fluorine ions 1024 can be performed with an ion implantation energy of about 20 KeV to about 30 KeV. If the ion implantation energy is less than 20 KeV, fluorine ions 1024 may not have adequate energy to penetrate and dope nitride layer 714. On the other hand, if the ion implantation energy is greater than 30 KeV, fluorine ions 1024 may penetrate fin structure 106B and contaminate lightly-doped S/D regions 911.

Figure 16B:
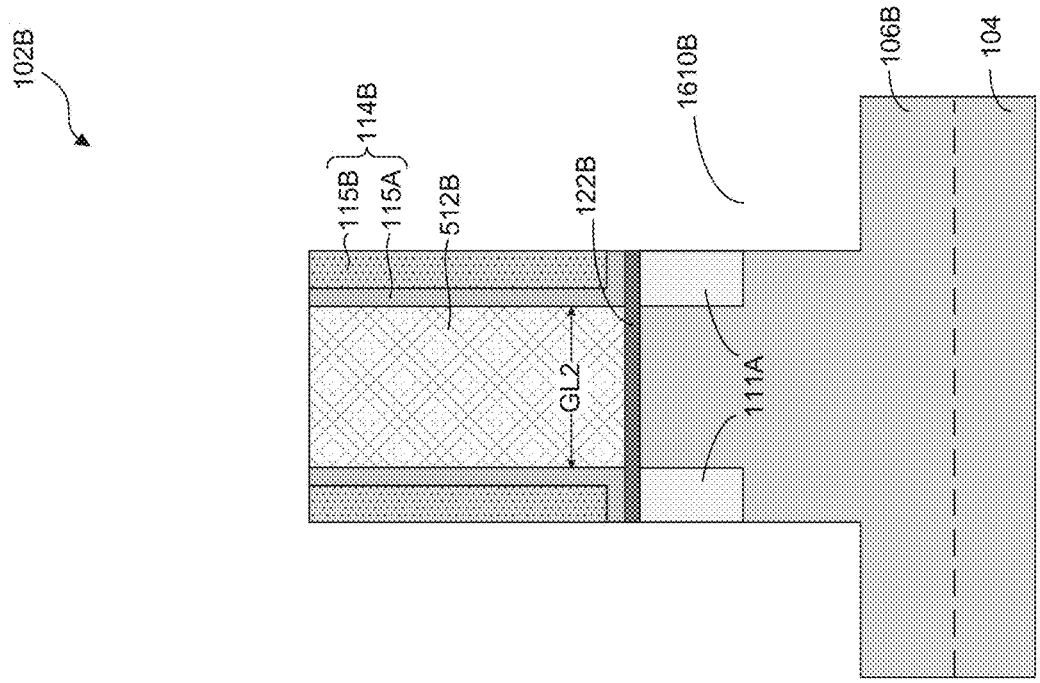
Figure 16A:
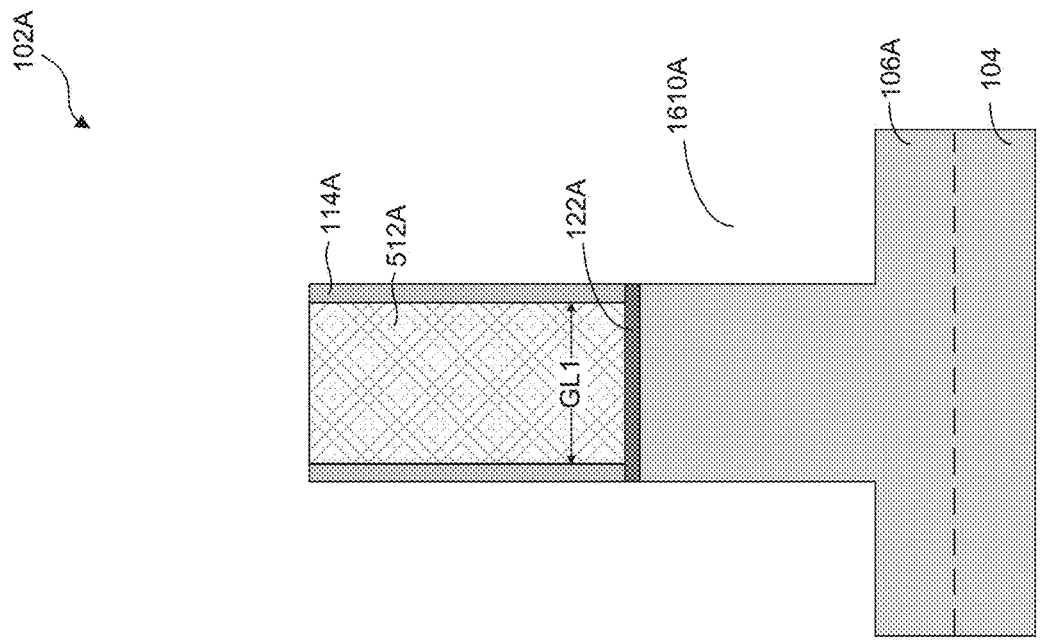

Referring to FIG. 2, in operation 230, first and second heavily-doped S/D regions are formed on the first and second fin structures, respectively. For example, as described with reference to FIGS. 16A-16B, heavily-doped S/D regions 110A and 111B are formed on fin structure 106A and 106B, respectively. The formation of S/ heavily-doped S/D regions 110A and 111B can include sequential operations of (i) forming S/D openings 1610A and 1610B, as shown in FIGS. 16A-16B, (ii) epitaxially growing a semiconductor material in S/D openings 1610A and 1610B to form the structures of FIGS. 17A-17B, and (iii) doping the semiconductor material with a dopant concentration higher than a dopant concentration of lightly-doped S/D regions 111A. After the formation of heavily-doped S/D regions 110A and 111B, ESL 117 and ILD layer 118 can be formed, as shown in FIGS. 17A-17B.

Figures 18A, 18B:
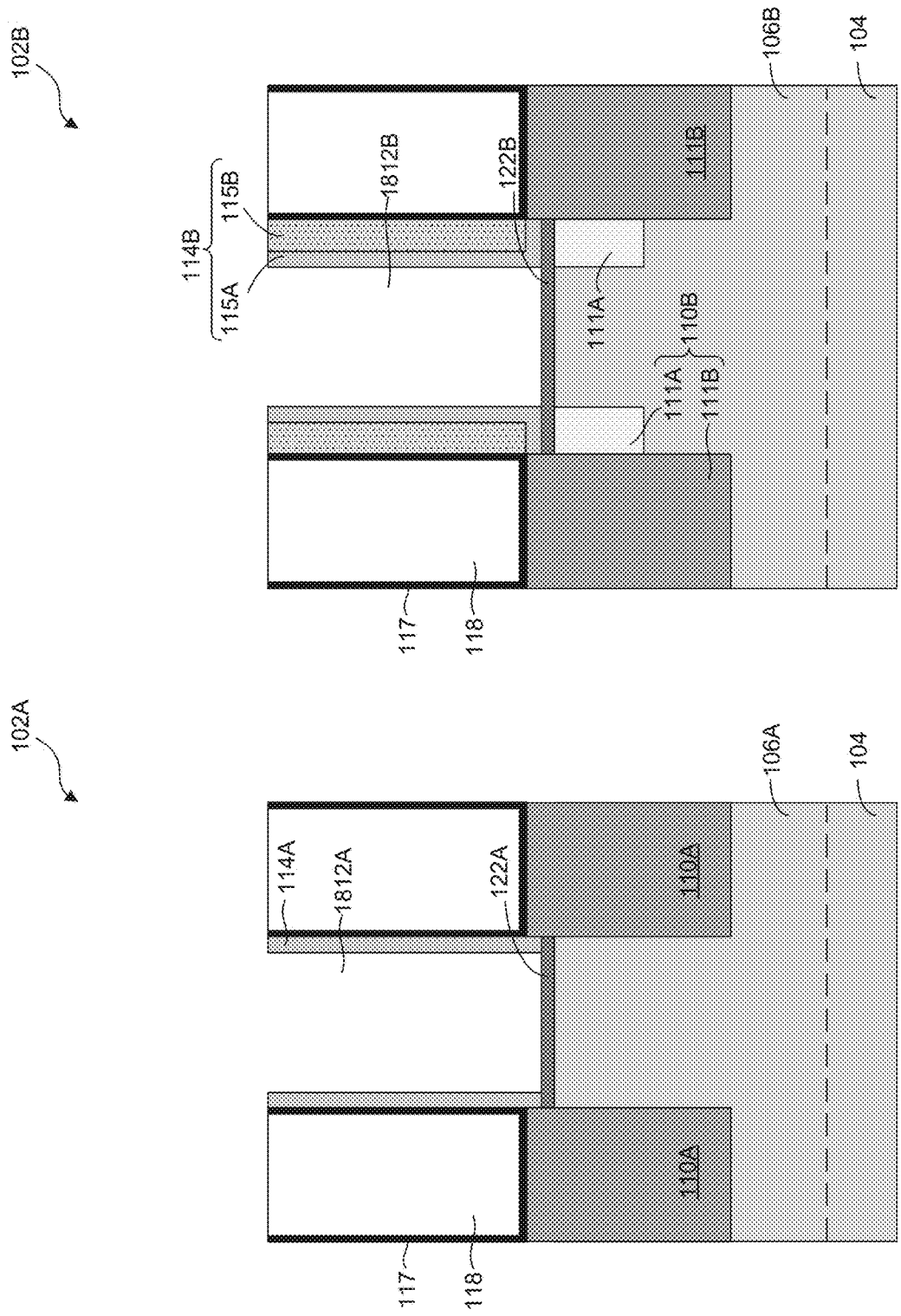
Figures 19A, 19B:
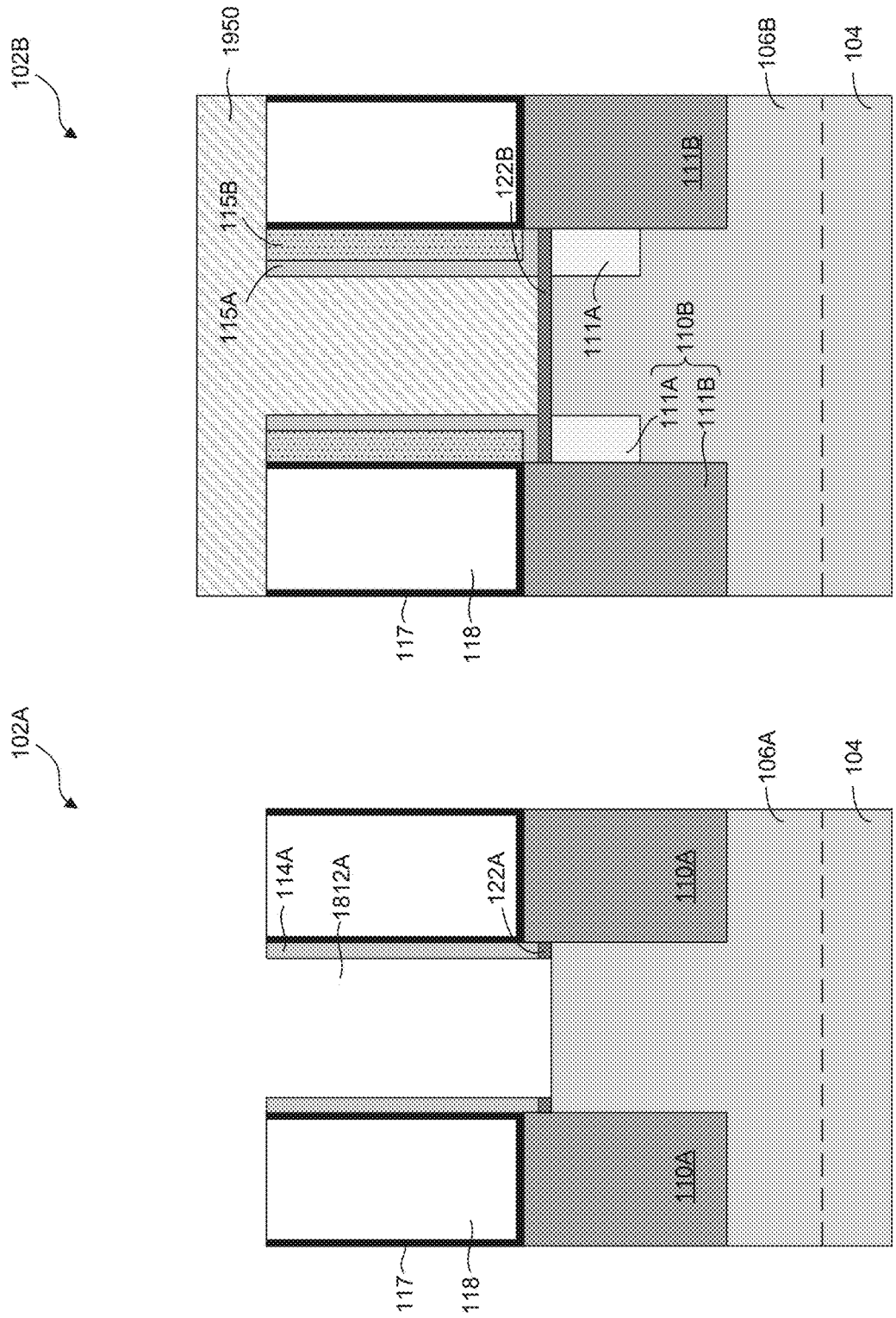
Figures 20A, 20B:
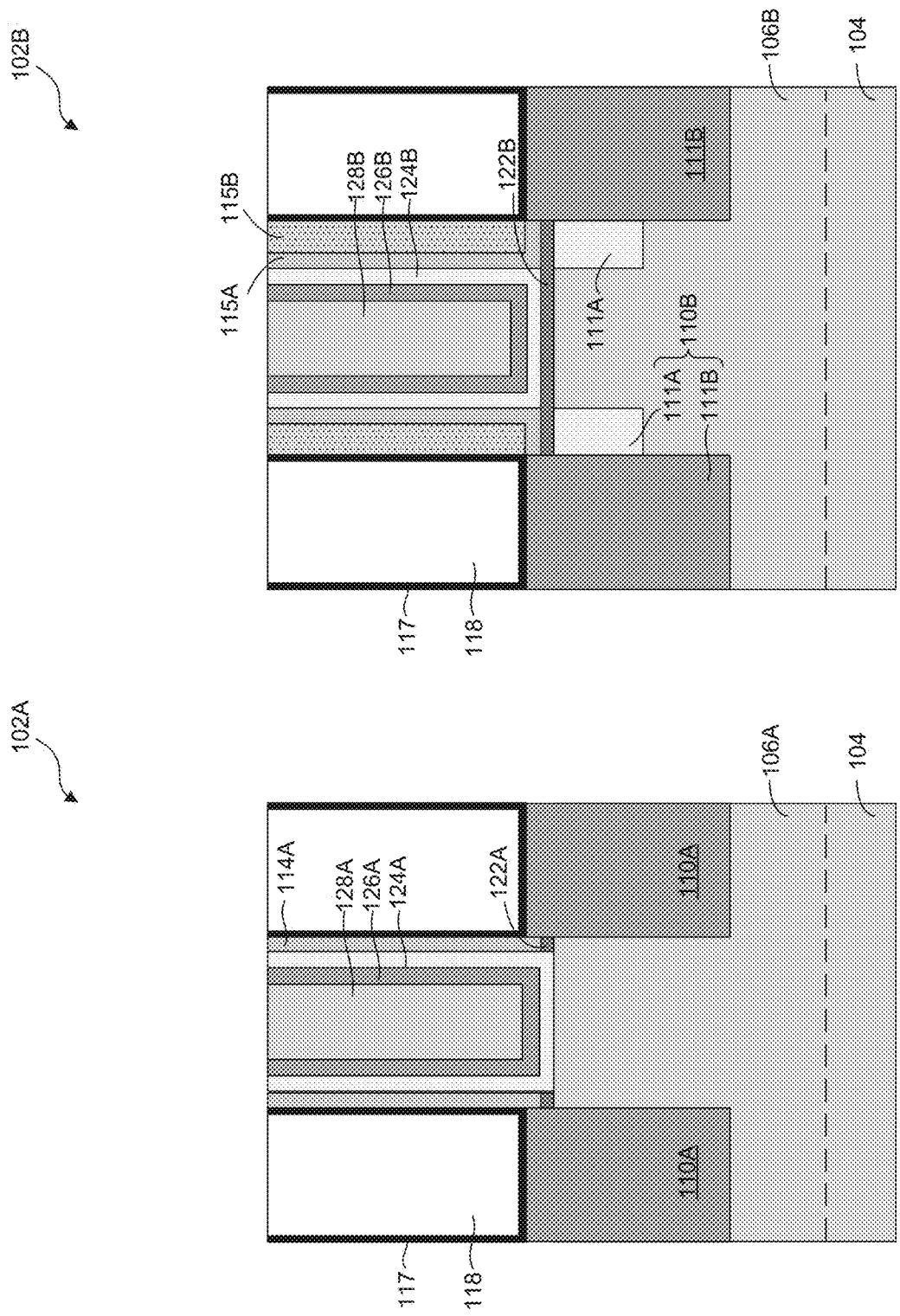
Figures 21A, 21B:
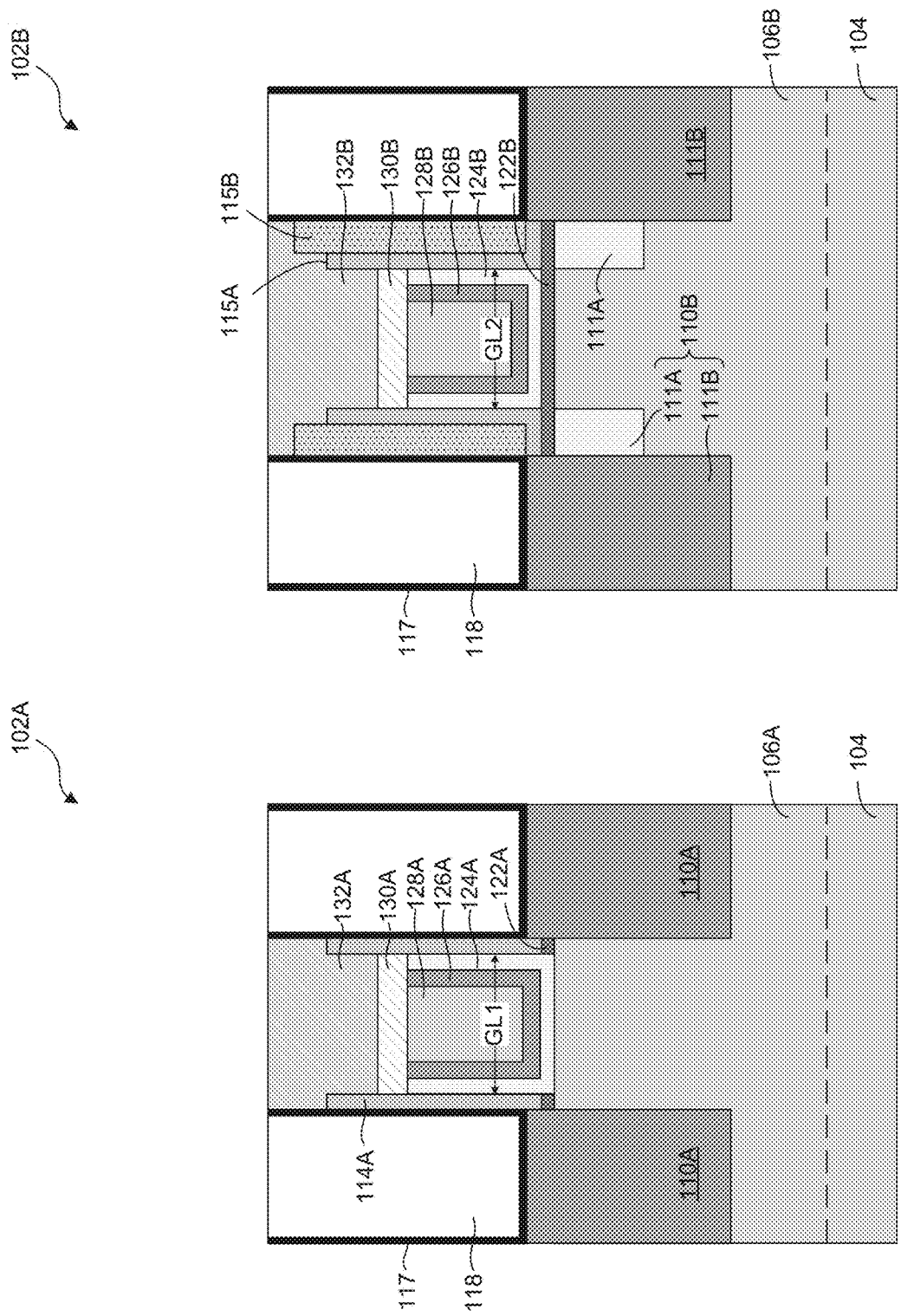

Referring to FIG. 2, in operation 235, the first and second polysilicon structures are replaced with first and second gate structures, respectively. For example, as described with reference to FIGS. 18A-21B, polysilicon structures 512A and 512B are replaced with gate structures 112A and 112B. The replacement of polysilicon structures 512A and 512B with gate structures 112A and 112B can include sequential operations of (i) forming gate openings 1812A and 1812B by removing polysilicon structures 512A and 512B, as shown in FIGS. 18A-18B, (ii) forming a masking layer 1950 on the structure of FIG. 18B to form the structure of FIG. 19B, (iii) removing the exposed portion of thermal oxide layer 122A in gate opening 1812A to form the structure of FIG. 19A, (iv) removing masking layer 1950, (v) depositing a HK gate dielectric layer on the structures of FIGS. 19A-19B after removing masking layer 1950, (vi) depositing a WFM layer on the HK gate dielectric layer, (vii) depositing a gate metal fill layer on the WFM layer, (viii) performing a CMP process on the HK gate dielectric layer, WFM layer, and the gate metal fill layer to form the structures of FIGS. 20A-20B, (ix) etching gate spacers 114A-114B, HK gate dielectric layers 124A-124B, WFM layers 126A-126B, and gate metal fill layers 128A-128B, as shown in FIGS. 21A-21B, (x) forming conductive capping layers 130A-130B, as shown in FIGS. 21A-21B, and (xi) forming insulating capping layers 132A-132B on conductive capping layers 130A-130B, as shown in FIGS. 21A-21B.

Figure 22B:
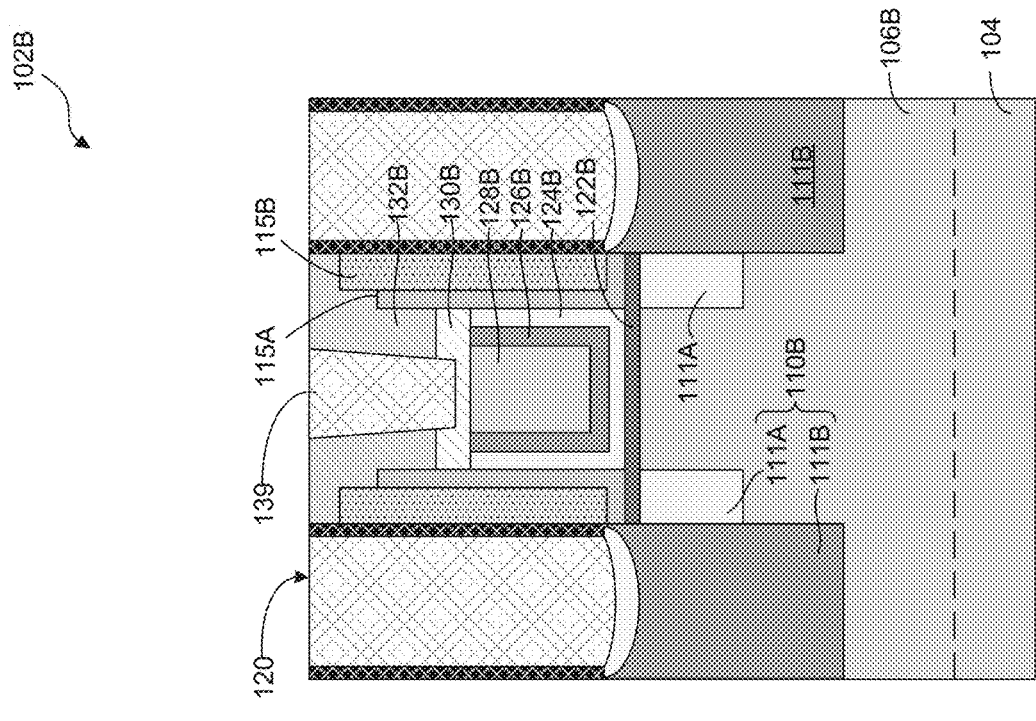
Figure 22A:
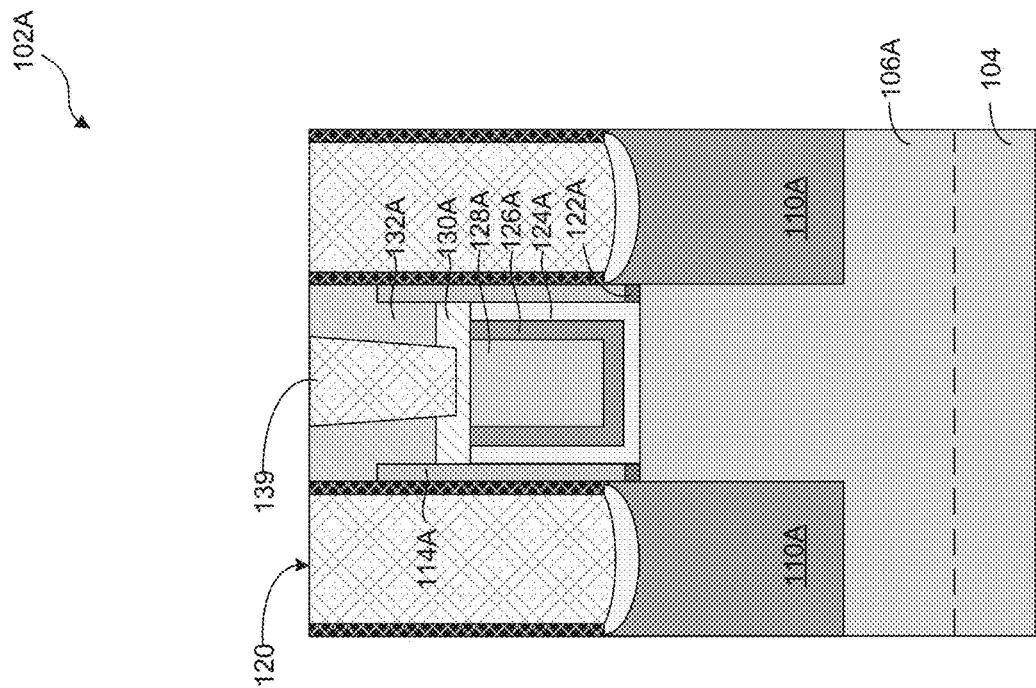

Referring to FIG. 2, in operation 240, contact structures are formed on the first and second heavily-doped S/D regions and on the first and second gate structures. For example, as shown in FIGS. 22A-22B, S/D contact structures 120 are formed on heavily-doped S/D regions 110A and 111B, and gate contact structures 139 are formed on gate structures 112A and 122B.

The present disclosure provides example structures of semiconductor devices (e.g., semiconductor device 100) with FETs (e.g., FETs 102A and 102B) having different gate structures (e.g., gate structures 112A and 112B) to provide different threshold voltages, and example methods (e.g., method 200) of forming such multi-Vt FETs on the same substrate (e.g., substrate 104). In some embodiments, the semiconductor device includes a non-I/O FET (e.g., FET 102A) with a low threshold voltage (e.g., threshold voltage between about 100 mV and about 200 mV) and an I/O FET (e.g., FET 102B) with a high threshold voltage (e.g., threshold voltage between about 3 V and about 5 V). In some embodiments, the non-I/O FETs can be a core device, a logic device, or a memory device that is not configured to handle the input/output voltages/currents directly. In some embodiments, the gate oxide layer (e.g., gate oxide layer 125) of the I/O FET can be thicker than the gate oxide layer (e.g., gate oxide layer 124A) of the non-I/O FET to achieve higher threshold voltage in the I/O FET. In some embodiments, the gate oxide layers of the I/O and non-I/O FETs include non-thermal oxide layers (e.g., non-thermal oxide layers 124A and 124B) with substantially equal thicknesses and the same materials. The gate oxide layer of the I/O FET additionally includes a thermal oxide layer (e.g., thermal oxide layer 122B) to form the thicker gate oxide layer. In some embodiments, the metal gate layers of the I/O and non-I/O FETs have substantially equal thicknesses and the same materials. To reduce the complexities of forming the I/O and non-I/O FET gate structures in the same gate replacement process, the non-thermal oxide layers and the metal gate layers with similar thicknesses are formed substantially at the same time, whereas the thermal oxide layer of the I/O FET gate structure is formed in an oxidation process prior to the gate replacement process. As a result, the thickness of the thermal oxide layer can be individually controlled to tune the EWF value of the I/O FET gate structure, consequently adjusting the threshold voltage of the I/O FET without varying the gate layer thicknesses formed in the I/O and non-I/O FET gate structures during the gate replacement process.

The high threshold voltage of the I/O FET can require a higher bias voltage for the operation of the I/O FET than that required for the operation of the non-I/O FET. The high bias voltage can induce hot carrier effect at the interface between the gate oxide layer and the channel region near the heavily-doped source/drain (S/D) region (e.g., heavily-doped S/D region 111B) of the I/O FET, resulting in the degradation of the gate structure and FET performance. To minimize or prevent the hot carrier effect, the channel region and the heavily-doped S/D regions are laterally separated from each other by lightly-doped S/D regions (e.g., lightly-doped S/D regions 111A). In some embodiments, the widths (e.g., widths W3) of the lightly-doped S/D are defined by the overlying gate spacers (e.g., gate spacers 114B) along sidewalls of the I/O FET gate structure (e.g., gate structure 112B). In some embodiments, the gate spacers of the I/O FET can be thicker than the gate spacers (e.g., gate spacers 114A) of the non-I/O FET to form the underlying lightly-doped S/D region, which may not be included in the non-I/O FET.

In some embodiments, a method includes forming a fin structure on a substrate, forming a thermal oxide layer on top and side surfaces of the fin structure, forming a polysilicon structure on the thermal oxide layer, doping portions of the fin structure uncovered by the polysilicon structure to form doped fin portions, forming a nitride layer on the polysilicon structure and the thermal oxide layer, forming an oxide layer on the nitride layer, doping the nitride layer with halogen ions, forming a source/drain region in the fin structure and adjacent to the polysilicon structure, and replacing the polysilicon structure with a gate structure.

In some embodiments, a method includes forming a first fin structure with a first fin width and a second fin structure with a second fin width on a substrate. The second fin width is greater than the first fin width. The method further includes forming first and second thermal oxide layers on the first and second fin structure, respectively, forming first and second polysilicon structures on the first and second thermal oxide layers, respectively, forming a masking layer on the first polysilicon structure and the first thermal oxide layer, doping portions of the second fin structure uncovered by the second polysilicon structure to form doped fin portions, forming a nitride layer on the first and second polysilicon structures and the first and second thermal oxide layers, forming an oxide layer on portions of the nitride layer on the second polysilicon structure and the second thermal oxide layer, doping the portions of the nitride layer on the second polysilicon structure and the second thermal oxide layer with halogen ions, and replacing the first and second polysilicon structures with first and second gate structures.

In some embodiments, a semiconductor device includes a substrate, a fin structure disposed on the substrate, a gate structure disposed on the fin structure, and a gate spacer with a nitride layer and an oxide layer disposed on a sidewall of the gate structure. A gate oxide layer of the gate structure extends under the gate spacer. The semiconductor device further includes a first source/drain region disposed in a portion of the fin structure under the gate spacer and a second source/drain region disposed adjacent to the first source/drain region and on the fin structure. A width of the first source/drain region is substantially equal to a width of the gate spacer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a fin structure on a substrate;
    forming a thermal oxide layer on top and side surfaces of the fin structure;
    forming a polysilicon structure on the thermal oxide layer;
    doping, through the thermal oxide layer, portions of the fin structure that are uncovered by the polysilicon structure to form doped fin portions;
    forming a nitride layer on the polysilicon structure and the thermal oxide layer;
    forming an oxide layer on the nitride layer;
    doping the nitride layer with halogen ions;
    forming a source/drain region in the fin structure and adjacent to the polysilicon structure; and
    replacing the polysilicon structure with a gate structure.

2. The method of claim 1, wherein forming the thermal oxide layer comprises performing a thermal oxidation process on the fin structure.

3. The method of claim 1, wherein doping the portions of the fin structure comprises performing an ion implantation on the fin structure through the thermal oxide layer.

4. The method of claim 1, wherein doping the portions of the fin structure comprises doping the portions of the fin structure with a dopant concentration less than a dopant concentration of the source/drain region.

5. The method of claim 1, wherein doping the nitride layer with the halogen ions comprises performing an ion implantation with fluorine ions on the nitride layer.

6. The method of claim 1, wherein doping the nitride layer with the halogen ions comprises performing an ion implantation with fluorine ions at an implantation energy of about 20 KeV to about 30 KeV.

7. The method of claim 1, further comprising performing an anneal process on the nitride layer after doping the nitride layer with the halogen ions.

8. The method of claim 1, wherein forming the source/drain region in the fin structure comprises:
    epitaxially growing a semiconductor material on the fin structure; and
    doping the semiconductor material with a dopant concentration greater than a dopant concentration of the doped fin portions.

9. The method of claim 1, further comprising etching portions of the oxide layer and the nitride layer that are not on sidewalls of the polysilicon structure.

10. The method of claim 9, further comprising etching portions of the thermal oxide layer exposed after etching the portions of the nitride layer.

11. A method, comprising:
    forming a first fin structure with a first fin width and a second fin structure with a second fin width on a substrate, wherein the second fin width is greater than the first fin width;
    forming first and second thermal oxide layers on the first and second fin structure, respectively;
    forming first and second polysilicon structures on the first and second thermal oxide layers, respectively;
    forming a masking layer on the first polysilicon structure and the first thermal oxide layer;
    doping, through the second thermal oxide layer, portions of the second fin structure uncovered by the second polysilicon structure to form doped fin portions;
    forming a nitride layer on the first and second polysilicon structures and the first and second thermal oxide layers;
    forming an oxide layer on portions of the nitride layer on the second polysilicon structure and the second thermal oxide layer,
    doping the portions of the nitride layer on the second polysilicon structure and the second thermal oxide layer with halogen ions; and
    replacing the first and second polysilicon structures with first and second gate structures.

12. The method of claim 11, wherein doping the portions of the nitride layer comprises performing an ion implantation with fluorine ions on the portions of the nitride layer.

13. The method of claim 11, wherein doping the portions of the nitride layer comprises performing an ion implantation with fluorine ions at an implantation energy of about 20 KeV to about 30 KeV.

14. The method of claim 11, further comprising etching portions of the oxide layer and the nitride layer that are not on sidewalls of the first and second polysilicon structures.

15. The method of claim 11, wherein replacing the first and second polysilicon structures with the first and second gate structures comprises:
    etching the first and second polysilicon structures;
    forming a masking a layer on a portion of the second thermal oxide layer exposed after etching the second polysilicon structure; and
    etching a portion of the first thermal oxide layer exposed after etching the first polysilicon structure.

16. The method of claim 11, wherein replacing the first and second polysilicon structures with the first and second gate structures comprises:
    forming a first non-thermal oxide layer in physical contact with the first fin structure; and
    forming a second non-thermal oxide layer in physical contact with the second thermal oxide layer.

17. A semiconductor device, comprising:
    a substrate;
    a fin structure disposed on the substrate;
    a metal gate structure comprising a gate oxide layer disposed on the fin structure;
    a gate spacer with a nitride layer and an oxide layer disposed on a sidewall of the gate structure, wherein the gate oxide layer extends under the gate spacer;
    a first source/drain region disposed in a portion of the fin structure under the gate spacer, wherein a width of the first source/drain region is substantially equal to a width of the gate spacer; and
    a second source/drain region disposed adjacent to the first source/drain region and on the fin structure.

18. The semiconductor device of claim 17, wherein the nitride layer comprises fluorine dopants.

19. The semiconductor device of claim 17, wherein a dopant concentration of the second source/drain region is greater than a dopant concentration of the first source/drain region.

20. The semiconductor device of claim 17, wherein a ratio between a thickness of the nitride layer and a thickness of the oxide layer is about 1:1 to about 1:3.

* * * * *